United States Patent
Ozaki et al.

(10) Patent No.: US 7,312,488 B2
(45) Date of Patent: Dec. 25, 2007

(54) SEMICONDUCTOR STORAGE DEVICE AND MANUFACTURING METHOD FOR THE SAME

(75) Inventors: Tohru Ozaki, Tokyo (JP); Iwao Kunishima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 11/134,414

(22) Filed: May 23, 2005

(65) Prior Publication Data

US 2006/0170019 A1 Aug. 3, 2006

(30) Foreign Application Priority Data

Jan. 28, 2005 (JP) ............... 2005-021796

(51) Int. Cl.
*H01L 29/76* (2006.01)
(52) U.S. Cl. ............. 257/295; 257/306; 257/751; 257/E27.086; 257/E27.104
(58) Field of Classification Search ............ 257/4, 257/5, 295, 296, 306, 310, 751, 532, E27.086, 257/E27.104
See application file for complete search history.

(56) References Cited

U.S. PATENT DOCUMENTS 6,930,340 B2 * 8/2005 Hasegawa et al. ......... 257/295
2002/0096771 A1 * 7/2002 Yamada et al. ............ 257/758
2002/0127867 A1 * 9/2002 Lee ......................... 438/694
2005/0242383 A1 * 11/2005 Mikawa ..................... 257/295
2006/0002170 A1 * 1/2006 Kumura et al. ............ 365/145

FOREIGN PATENT DOCUMENTS

JP 2001-237393 8/2001

OTHER PUBLICATIONS

Y. Nagano, et al. "0.18 μm SBT-Based Embedded FeRAM Operating at a Low Voltage of 1.1V", 2003 Symposium on VLSI Technology Digest of Technical Papers, 2 pages.

* cited by examiner

*Primary Examiner*—Minh-Loan Tran
(74) *Attorney, Agent, or Firm*—Oblon, Spivak, McClelland, Maier & Neustadt, P.C.

(57) ABSTRACT

There is provided a semiconductor storage device comprising a ferroelectric capacitor superior in barrier capability against penetration of hydrogen from all directions including a transverse direction. The device comprises a transistor formed on a semiconductor substrate, the ferroelectric capacitor formed above the transistor and including a lower electrode, a ferroelectric film, and an upper electrode, a first hydrogen barrier film which continuously surrounds side portions of a ferroelectric capacitor cell array constituted of a plurality of ferroelectric capacitors, and a second hydrogen barrier film which is formed above the ferroelectric capacitor cell array and which is brought into contact with the first hydrogen barrier film in the whole periphery.

14 Claims, 19 Drawing Sheets

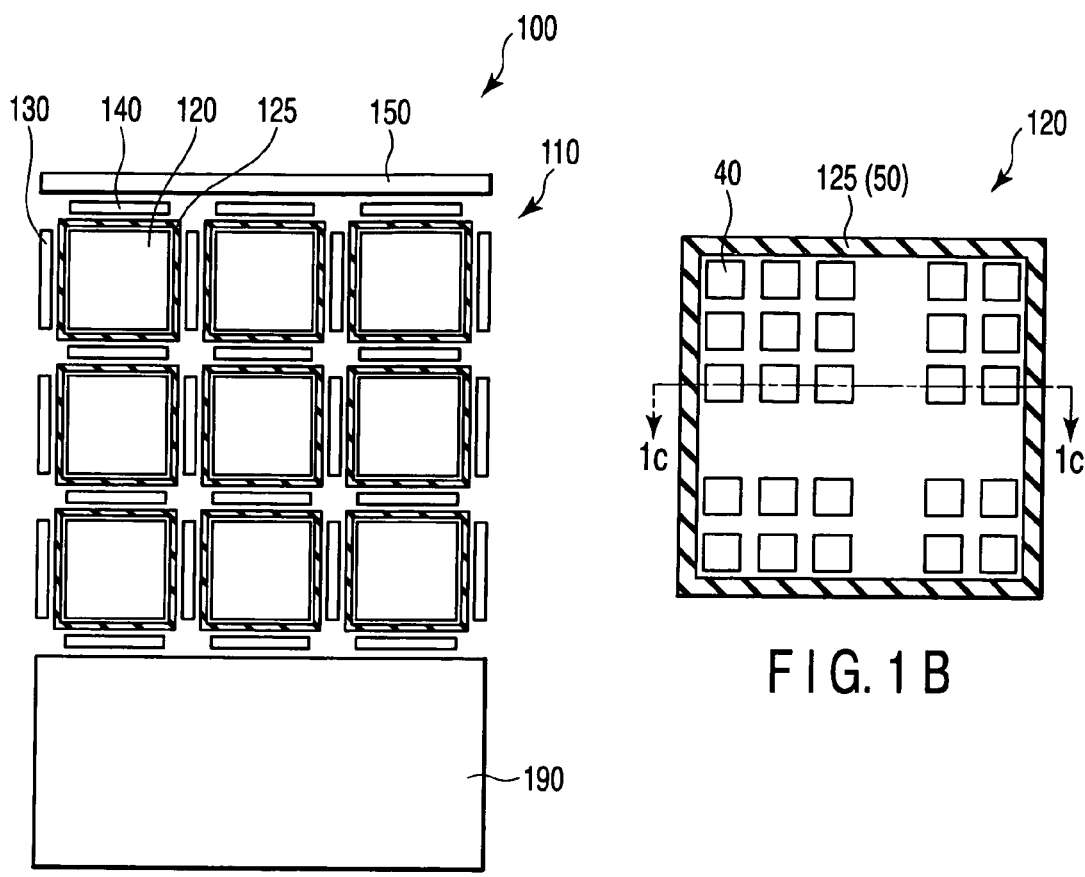
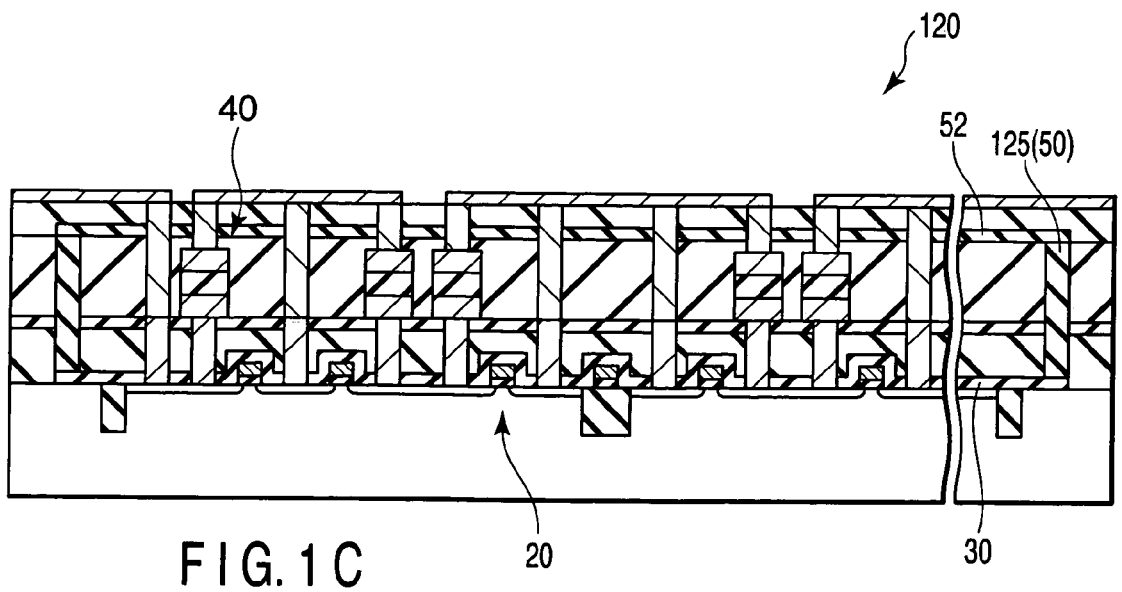

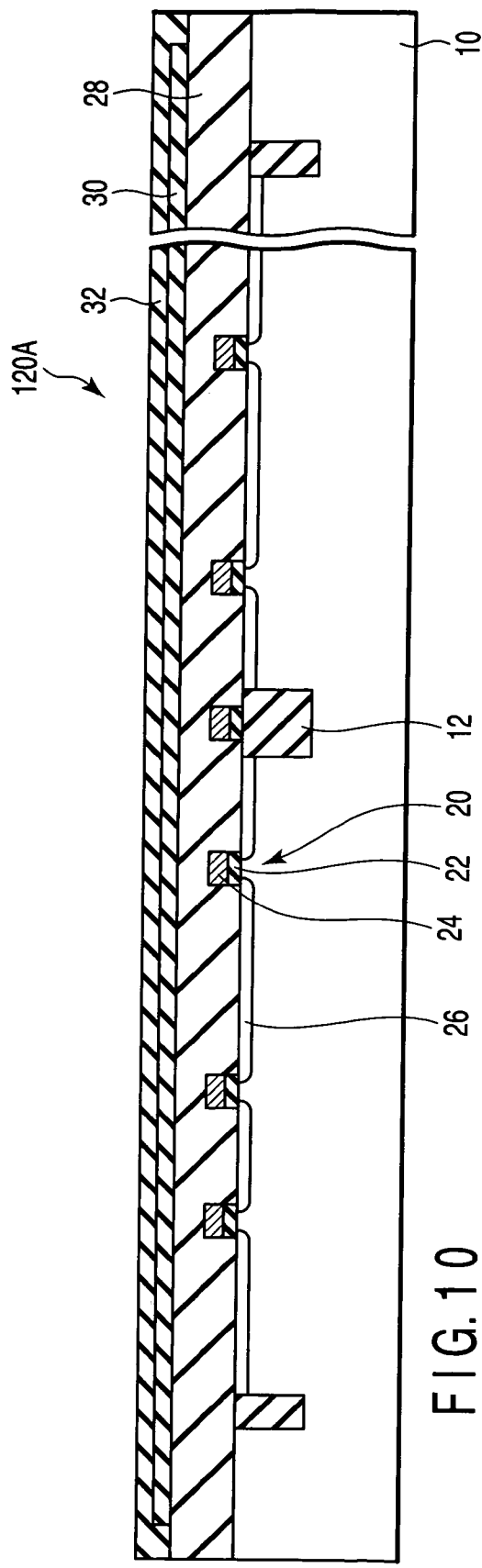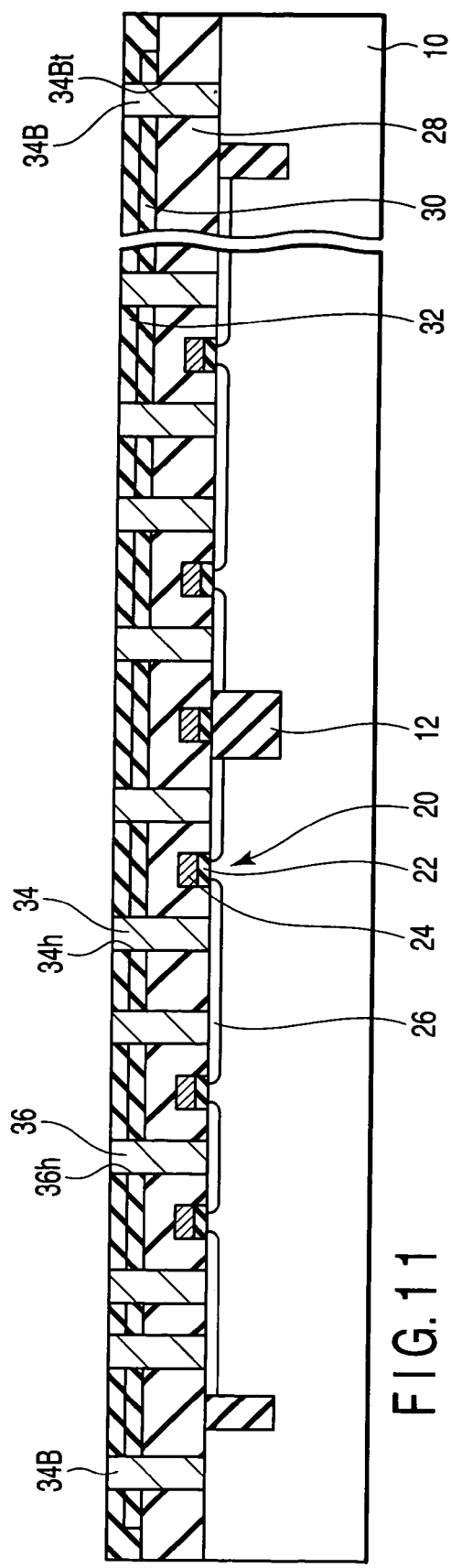

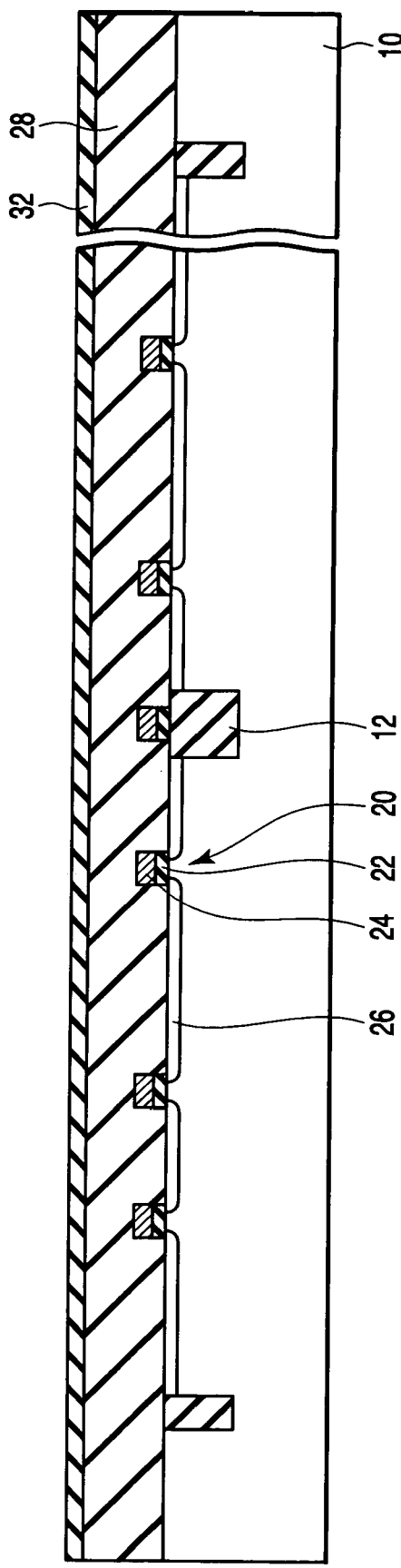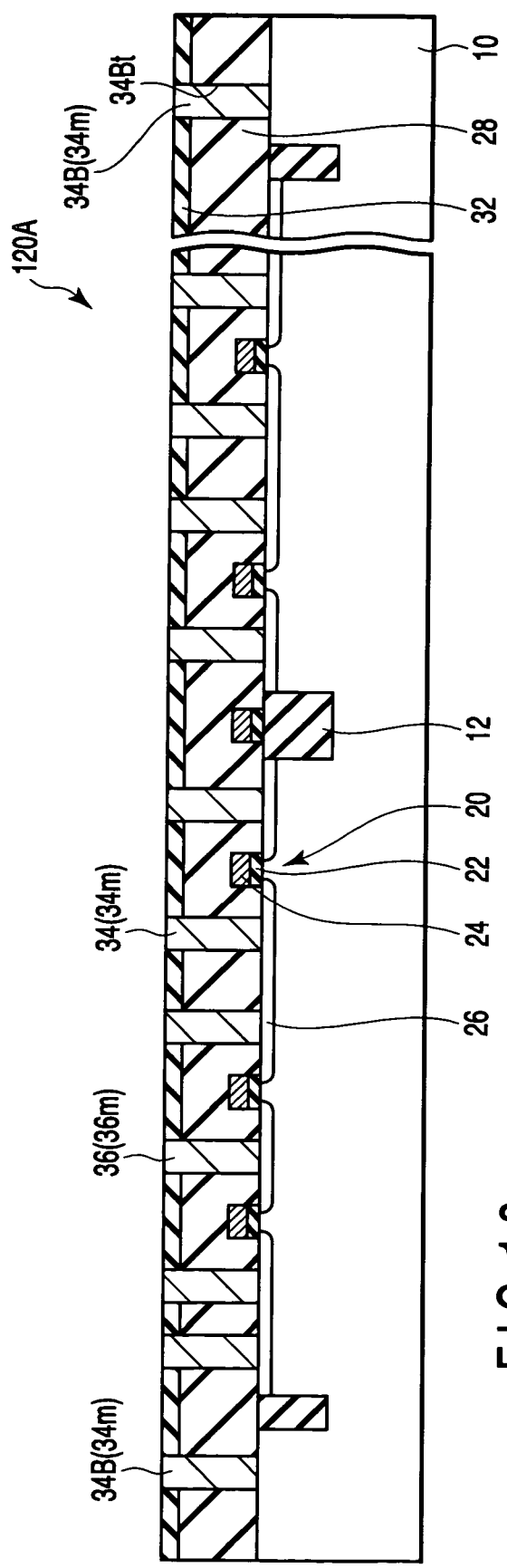
FIG. 17
FIG. 18

SEMICONDUCTOR STORAGE DEVICE AND MANUFACTURING METHOD FOR THE SAME

CROSS-REFERENCE TO RELATED APPLICATIONS

This application is based upon and claims the benefit of priority from prior Japanese Patent Application No. 2005-021796, filed Jan. 28, 2005, the entire contents of which are incorporated herein by reference.

BACKGROUND OF THE INVENTION

1. Field of the Invention

The present invention relates to a semiconductor device and a method for manufacturing the device, particularly to a semiconductor storage device using a ferroelectric film, and a method for manufacturing the device.

2. Description of the Related Art

In recent years, a ferroelectric storage device (FeRAM: ferroelectric random access memory) using a ferroelectric capacitor has been noted as one of nonvolatile semiconductor storage devices.

In semiconductor devices such as a ferroelectric storage device in which a ferroelectric film is used in a capacitor, if hydrogen penetrates the capacitor in a manufacturing process after forming the ferroelectric capacitor, characteristic of the capacitor, especially polarization characteristic of the ferroelectric film is deteriorated. To prevent the deterioration, the capacitor is covered with a hydrogen barrier film, for example, an aluminum oxide film ($Al_2O_3$ film), which protects the penetration of hydrogen.

One example of a ferroelectric storage device by a conventional technique is disclosed, for example, in Jpn. Pat. Appln. KOKAI Publication No. 2001-237393. The semiconductor device in the example includes: a MOSFET (metal oxide semiconductor field effect transistor) 2 formed on a semiconductor substrate 1; an insulator 4 formed on the MOSFET 2; a first hydrogen barrier film 5 disposed on the insulator 4; a ferroelectric capacitor constituted of a lower electrode 7, a ferroelectric film 8 and an upper electrode 9 disposed on the first hydrogen barrier film 5; and a second hydrogen barrier film 10 covering the ferroelectric capacitor. The second hydrogen barrier film 10 is brought into contact with the first hydrogen barrier film around the ferroelectric capacitor. Thus, when each ferroelectric capacitor is covered with the first and second hydrogen barrier films 5, 10, penetration of hydrogen into the ferroelectric capacitor is prevented.

Moreover, a structure in which a whole ferroelectric capacitor cell array constituted of a plurality of ferroelectric capacitors is covered with a hydrogen barrier film has been reported in "0.18 um SBT-based Embedded FeRAM Operating at a Low Voltage of 1.1V", by Y. Nagano et. al., 2003 Symposium on VLSI Technology Digest of Technical Paper. A semiconductor device in the article includes: a plurality of ferroelectric capacitors formed on a first hydrogen barrier film; an interlevel insulator which is formed to cover the plurality of ferroelectric capacitors and which is divided for each ferroelectric capacitor cell array; and a second hydrogen barrier film which covers the ferroelectric capacitor cell array including the interlevel insulator. The second hydrogen barrier film is brought into contact with the first hydrogen barrier film around the ferroelectric capacitor cell array.

In any of the above-described cases, the second hydrogen barrier film is simultaneously formed on upper and side surfaces of the ferroelectric capacitor or the ferroelectric capacitor cell array. The hydrogen barrier film formed on the side surface is generally inferior in film quality and step coverage as compared with the hydrogen barrier film formed on the upper surface which is a horizontal face. For example, even when the hydrogen barrier film is formed by atomic layer deposition (ALD) that is said to be a method achieving better step coverage, a film thickness on the side surface is about 70% of that on the upper surface. Therefore, it is hard to make a barrier capability against the penetration of hydrogen from the side surface to be equal to that from the upper surface.

Therefore, there has been a need for a semiconductor storage device comprising a ferroelectric capacitor superior in barrier capability against penetration of hydrogen from all directions including a transverse direction, and a method for manufacturing the device.

BRIEF SUMMARY OF THE INVENTION

The above-described problem is solved by a semiconductor storage device, and a method for manufacturing the device according to the present invention.

According to one aspect of the present invention, there is provided a semiconductor storage device comprising: a transistor formed on a semiconductor substrate; a ferroelectric capacitor formed above the transistor and including a lower electrode, a ferroelectric film, and an upper electrode; a first hydrogen barrier film which continuously surrounds side portions of a ferroelectric capacitor cell array constituted of a plurality of ferroelectric capacitors; and a second hydrogen barrier film which is formed above the ferroelectric capacitor cell array and which is brought into contact with the first hydrogen barrier film in a whole periphery.

According to another aspect of the present invention, there is provided a method for manufacturing a semiconductor storage device, comprising: forming a transistor on a semiconductor substrate; forming a ferroelectric capacitor including a lower electrode, a ferroelectric film, and an upper electrode above the transistor; forming a first hydrogen barrier film which continuously surrounds side portions of a ferroelectric capacitor cell array constituted of a plurality of ferroelectric capacitors; and forming a second hydrogen barrier film which is brought into contact with the first hydrogen barrier film in a whole periphery above the ferroelectric capacitor cell array.

BRIEF DESCRIPTION OF THE SEVERAL VIEWS OF THE DRAWING

FIGS. 1A to 1C are views to describe an outline of a first embodiment of the present invention; FIG. 1A is a plan view of a semiconductor device comprising a ferroelectric storage device; FIG. 1B is an enlarged view of one ferroelectric capacitor cell array constituting the ferroelectric storage device in FIG. 1A; and FIG. 1C is a sectional view along a cutting line 1C-1C shown in FIG. 1B;

FIGS. 10 to 14 are sectional views showing one example of manufacturing processes of the semiconductor device according to the second embodiment of the present invention;

FIGS. 17 to 21 are sectional views showing one example of manufacturing processes of the semiconductor device according to the third embodiment of the present invention;

DETAILED DESCRIPTION OF THE INVENTION

Figure 2:
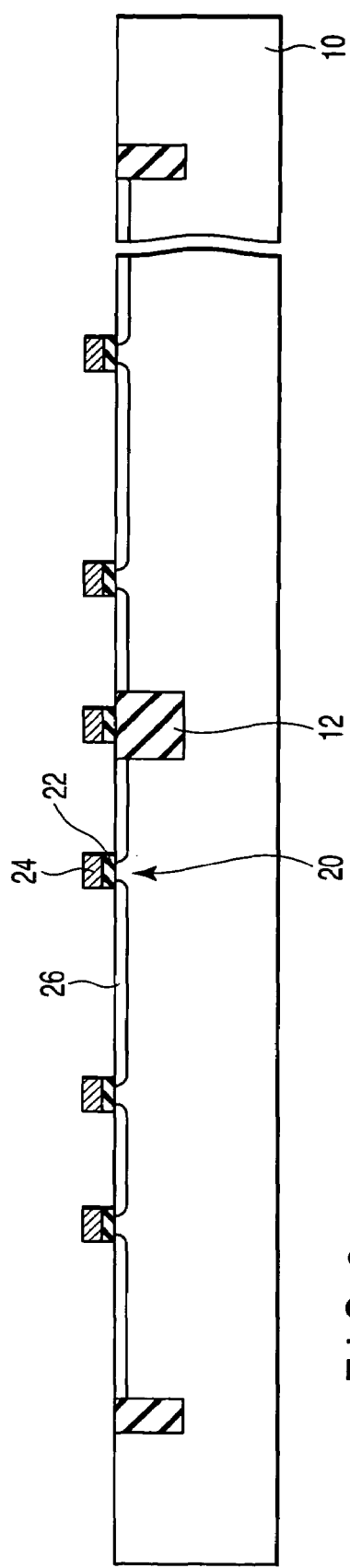
FIGS. 2 to 7 are sectional views showing one example of manufacturing processes of a semiconductor device according to the first embodiment of the present invention.

Embodiments of the present invention will be described hereinafter in detail with reference to the accompanying drawings. In the drawings, corresponding portions are denoted with corresponding reference numerals. Each of the following embodiments is illustrated as one example, and therefore the present invention can be variously modified and implemented without departing from the spirits of the present invention.

First Embodiment

In a first embodiment of the present invention, a hydrogen barrier wall which surrounds the whole circumference of a ferroelectric capacitor array constituted of a plurality of ferroelectric capacitors is formed to be sufficiently thick, and accordingly a barrier capability against penetration of hydrogen from a transverse direction of the ferroelectric capacitor is increased. Furthermore, hydrogen barrier films are disposed on a MOS transistor below the ferroelectric capacitor and above the ferroelectric capacitor, and the whole periphery of the hydrogen barrier films are brought into contact with the hydrogen barrier wall. Consequently, the semiconductor storage device comprises a structure in which whole ferroelectric capacitor cell array can be covered with the hydrogen barrier film without any gap and whose barrier capability has been enhanced against hydrogen that is to penetrate the ferroelectric capacitor from any directions.

FIGS. 1A to 1C are views illustrating an outline of the present embodiment, FIG. 1A is a plan view of a semiconductor device 100 comprising a ferroelectric storage device 110, FIG. 1B is an enlarged view of one ferroelectric capacitor cell array 120 constituting the ferroelectric storage device 110, and FIG. 1C is a schematic sectional view along a cutting line 1C-1C in FIG. 1B.

As shown in FIG. 1A, the semiconductor device 100 comprises the ferroelectric storage device 110, and a peripheral circuit 190 including a logic device. The ferroelectric storage device 110 further comprises a plurality of ferroelectric capacitor cell arrays 120, a plurality of column control circuits 130 and row control circuits 140 disposed around each of the ferroelectric capacitor cell arrays, and a memory driving circuit 150. As shown in FIGS. 1B, 1C, each ferroelectric capacitor cell array 120 include a plurality of ferroelectric capacitors 40 arranged two-dimensionally. The column control circuit 130 and the row control circuit 140 are arranged along the circumference of each ferroelectric capacitor cell array 120. In the present embodiment, a hydrogen barrier wall 125 surrounds the circumference of each ferroelectric capacitor cell array 120, and is disposed between the ferroelectric capacitor cell array 120 and the column control circuit 130 or the row control circuit 140.

As shown in FIG. 1C, a lower end of the hydrogen barrier wall 125 (second hydrogen barrier film 50) is brought into contact with a first hydrogen barrier film 30 formed on a MOS transistor 20 below the ferroelectric capacitor cell array 120 in the whole periphery. An upper end of the hydrogen barrier wall 125 is brought into contact with a third hydrogen barrier film 52 formed above the ferroelectric capacitor cell array 120.

One example of a manufacturing process of the semiconductor storage device of the present embodiment will be described with reference to sectional views shown in FIGS. 2 to 7.

(1) First, as shown in FIG. 2, a MOS transistor 20 is being formed on a semiconductor substrate 10, for example, a silicon substrate 10.

Referring to FIG. 2, well (not shown) and isolation 12 are formed in the semiconductor substrate 10. Then, a gate insulator 22 is formed on an entire surface. As the gate insulator, for example, silicon oxide ($SiO_2$), or silicon oxynitride (SiON) can be used. A conductive material for a gate electrode 24, for example, polycrystal silicon to which phosphorus (P) is doped with a high concentration, or tungsten (W) is deposited on the gate insulator 22. The conductive material for the gate electrode is processed to form the gate electrode 24 by lithography and etching. A source/drain 26 is formed by ion-implanting, or example, arsenic (As) with a high concentration. Thus, the MOS transistor 20 shown in FIG. 2 can be formed on the semiconductor substrate 10.

Figure 3:
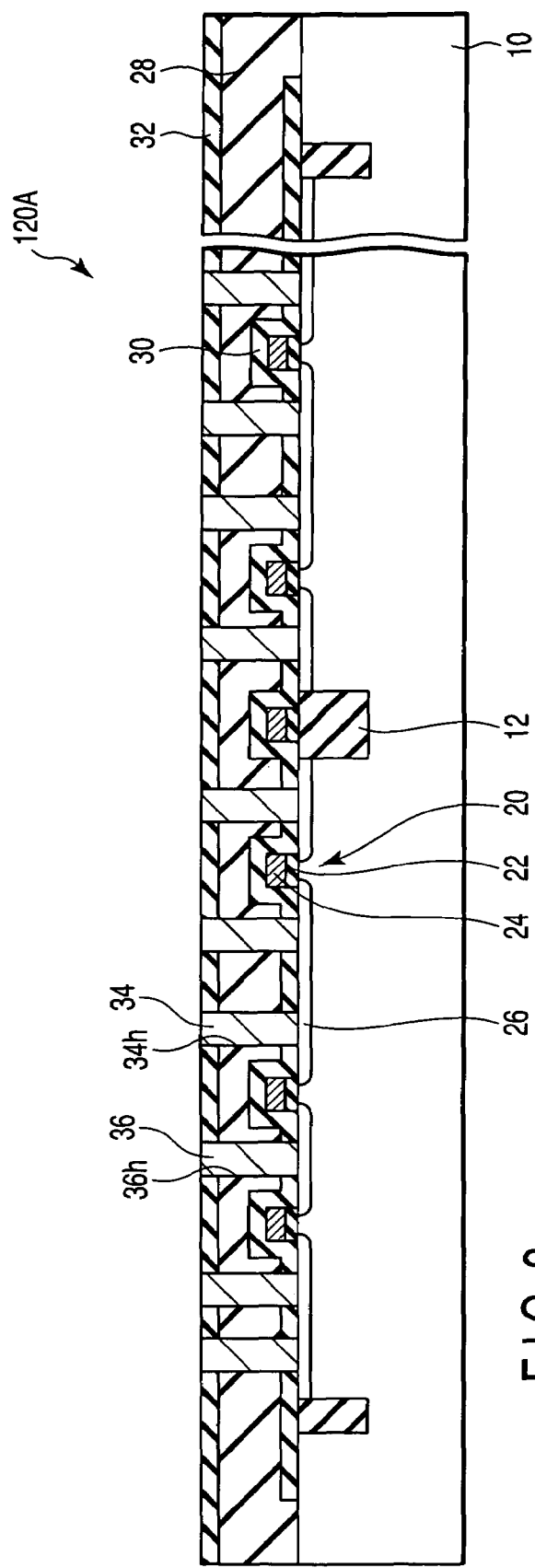

(2) Next, as shown in FIG. 3, a first hydrogen barrier film 30 is being formed on an entire surface, and being planarized using a first interlevel insulator 28, and further first and second contact plugs 34, 36 are being formed.

Referring to FIG. 3, the first hydrogen barrier film 30 is deposited on the entire surface of the MOS transistor 20. As the first hydrogen barrier film, for example, aluminum oxide ($Al_2O_3$), silicon nitride (SiN) or the like can be used. The first hydrogen barrier film 30 in a region other than a ferroelectric capacitor cell array region 120A to be formed thereabove is removed by lithography and etching. The first interlevel insulator 28 is deposited on an entire surface of the substrate including on the first hydrogen barrier film 30, and thereafter planarized, for example, by chemical-mechanical polishing (CMP). As the first interlevel insulator 28, $SiO_2$ film formed, for example, by chemical vapor deposition (CVD) can be used. Then, a first insulator 32 is deposited on an entire surface of the first interlevel insulator 28.

First and second contact holes 34h, 36h reaching the source/drain 26 are formed in the first insulator 32, first interlevel insulator 28, and first hydrogen barrier film 30 by lithography and etching. For example, tungsten (W) is deposited to fill in the first and second contact holes 34h, 36h. Then, tungsten deposited on the surface is removed by CMP using the first insulator 32 as a stopper thereby forming first and second contact plugs 34, 36. Thus, the first hydrogen barrier film 30 and the first and second contact plugs 34, 36 can be formed as shown in FIG. 3.

Figure 4:
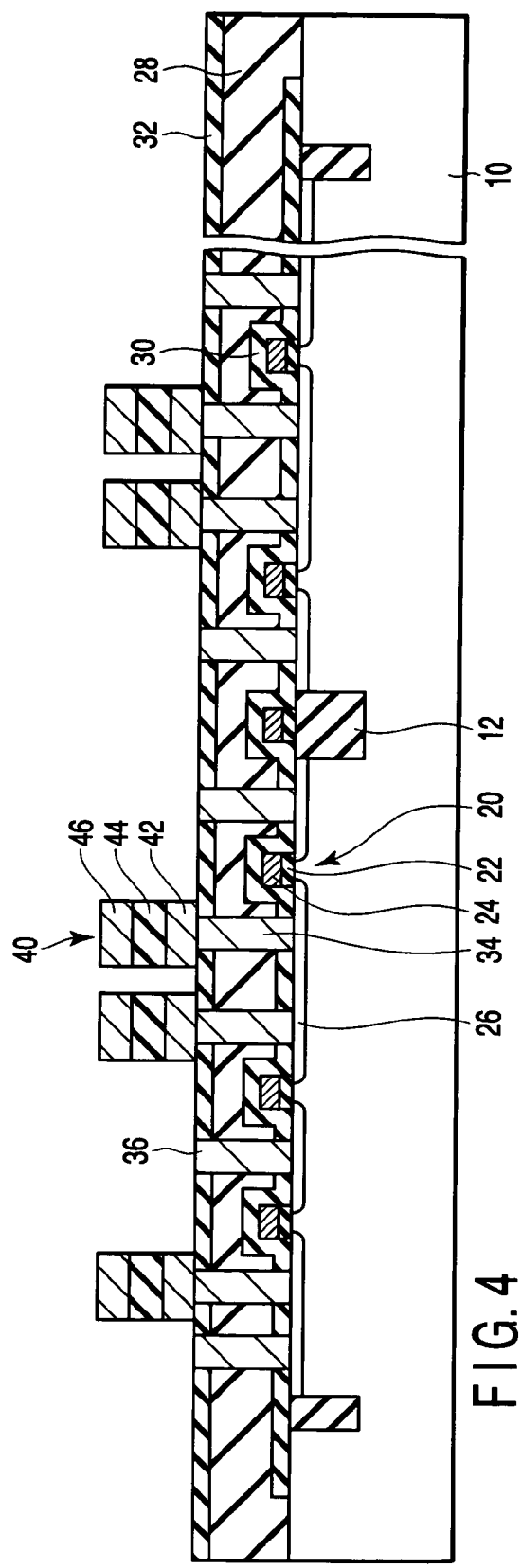

(3) Next, as shown in FIG. 4, a ferroelectric capacitor 40 is being formed on the first contact plug 34.

Referring to FIG. 4, materials constituting a lower electrode 42, a ferroelectric film 44, and an upper electrode 46 of the ferroelectric capacitor 40 are deposited in order on the entire surface of the substrate including the surface of the first insulator 32. As the lower electrode 42 of the ferroelectric capacitor 40, for example, titanium aluminum titanate (TiAlN), titanium nitride (TiN), iridium (Ir), iridium oxide ($IrO_2$), platinum (Pt), strontium ruthenium oxide (SrRuO), or a stacked film of any of them can be used. As the ferroelectric film 44, metal oxide having a perovskite structure, for example, lead zirconate titanate (PZT) or strontium bismuth tantalite (SBT) can be used. As the upper electrode 46, for example, Ir, $IrO_2$, Pt, SrRuO, or a stacked film of them can be used. Thereafter, the upper electrode 46, ferroelectric film 44, and lower electrode 42 are processed by lithography and etching using one mask, thus the ferroelectric capacitor 40 connected to the first contact plug 34 is formed.

Figure 5:
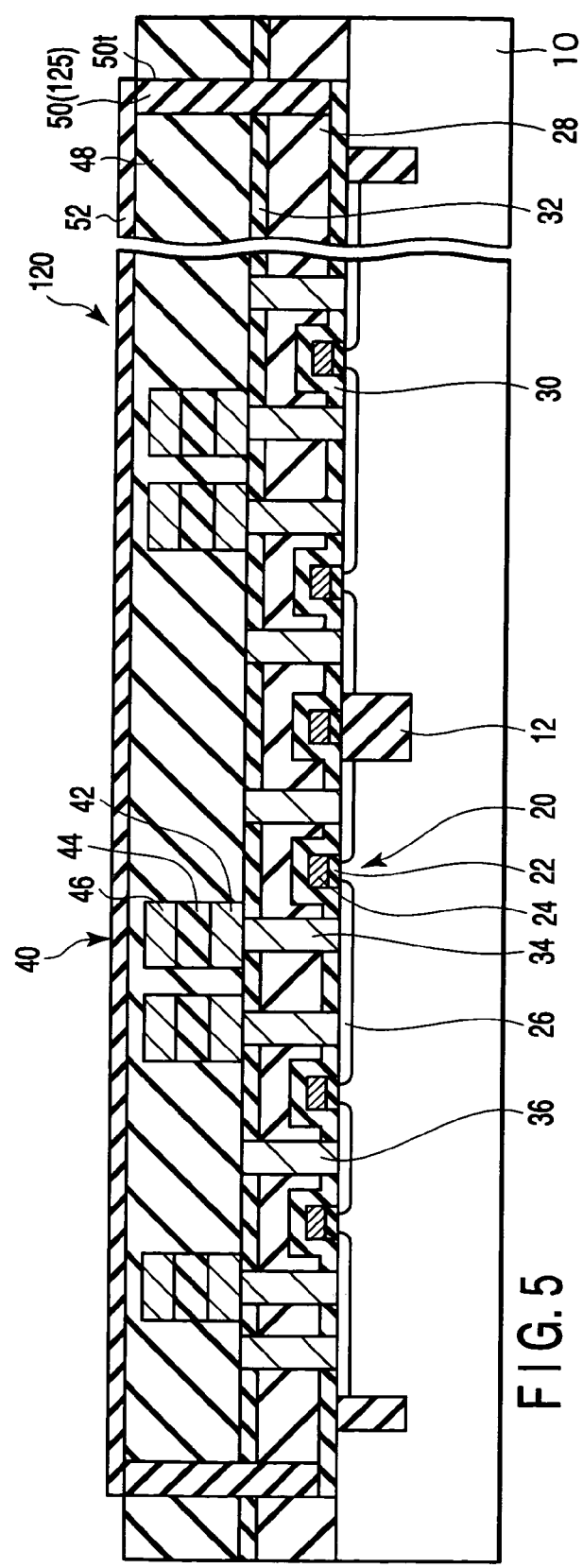

(4) Next, as shown in FIG. 5, the ferroelectric capacitor 40 is being planarized with a second interlevel insulator 48, and a second hydrogen barrier film 50, that is, a hydrogen barrier wall 125 is being formed in the circumference of the ferroelectric capacitor cell array 120. Furthermore, a third hydrogen barrier film 52 is being deposited on an entire surface to cover the whole ferroelectric capacitor cell array 120 with the hydrogen barrier films.

Referring to FIG. 5, the second interlevel insulator 48 is deposited to be thick to fill a space between the ferroelectric capacitors 40. As the second interlevel insulator 48, a material which can be isotropically deposited at low temperature, for example, CVD-$SiO_2$ formed using TEOS-$O_3$ can be used. Moreover, the second interlevel insulator 48 is planarized, for example, by CMP. Thereafter, in the circumference of the ferroelectric capacitor cell array 120, a trench 50t for a second hydrogen barrier film, which is a ring-shaped continuous trench reaching the first hydrogen barrier film 30 on the silicon substrate 10, is formed by lithography and etching. Then, the second hydrogen barrier film 50 is deposited to fill inside of the trench 50t for the second hydrogen barrier film. As the second hydrogen barrier film 50, for example, TiAlN, TiN, $Al_2O_3$, SiN or the like can be used. The second hydrogen barrier film 50 deposited on the surface of the second interlevel insulator 48 is removed, for example, by CMP. The removing of the second hydrogen barrier film 50 deposited on the surface cannot be omitted in a case where a conductive film of TiAlN or TiN is used as the second hydrogen barrier film 50. Moreover, the third hydrogen barrier film 52 is deposited on an entire surface of the second interlevel insulator 48. As the third hydrogen barrier film 52, an insulator having a hydrogen barrier capability, such as $Al_2O_3$, SiN, can be used. The third hydrogen barrier film 52 on a region other than the ferroelectric capacitor cell array 120 is removed by lithography and etching. The third hydrogen barrier film 52 is brought into contact with the second hydrogen barrier film 50 in the whole periphery.

As described above, as shown in FIG. 5, the whole ferroelectric capacitor cell array 120 can be surrounded with the first, second, and third hydrogen barrier films 30, 50, 52.

Figure 8:
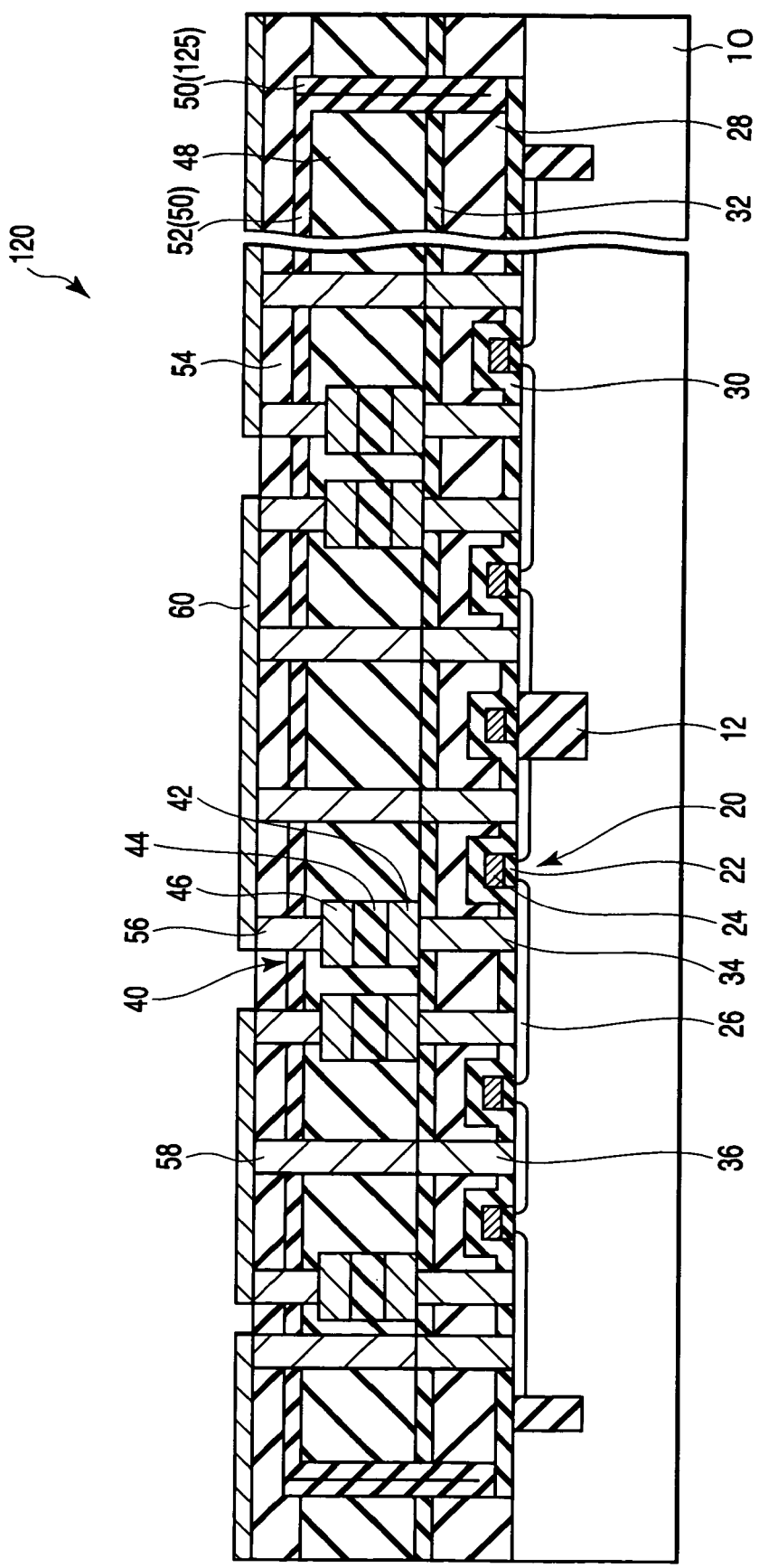
FIG. 8 is a sectional view showing one example of a semiconductor device according to a modification of the first embodiment.

It is to be noted that, as shown in FIG. 8, the second hydrogen barrier film 50 and the third hydrogen barrier film 52 can be simultaneously or integrally formed, for example, in a case where a hydrogen barrier insulator of $Al_2O_3$, SiN or the like is used as the second hydrogen barrier film 50. This will be described later in detail.

Figure 6:
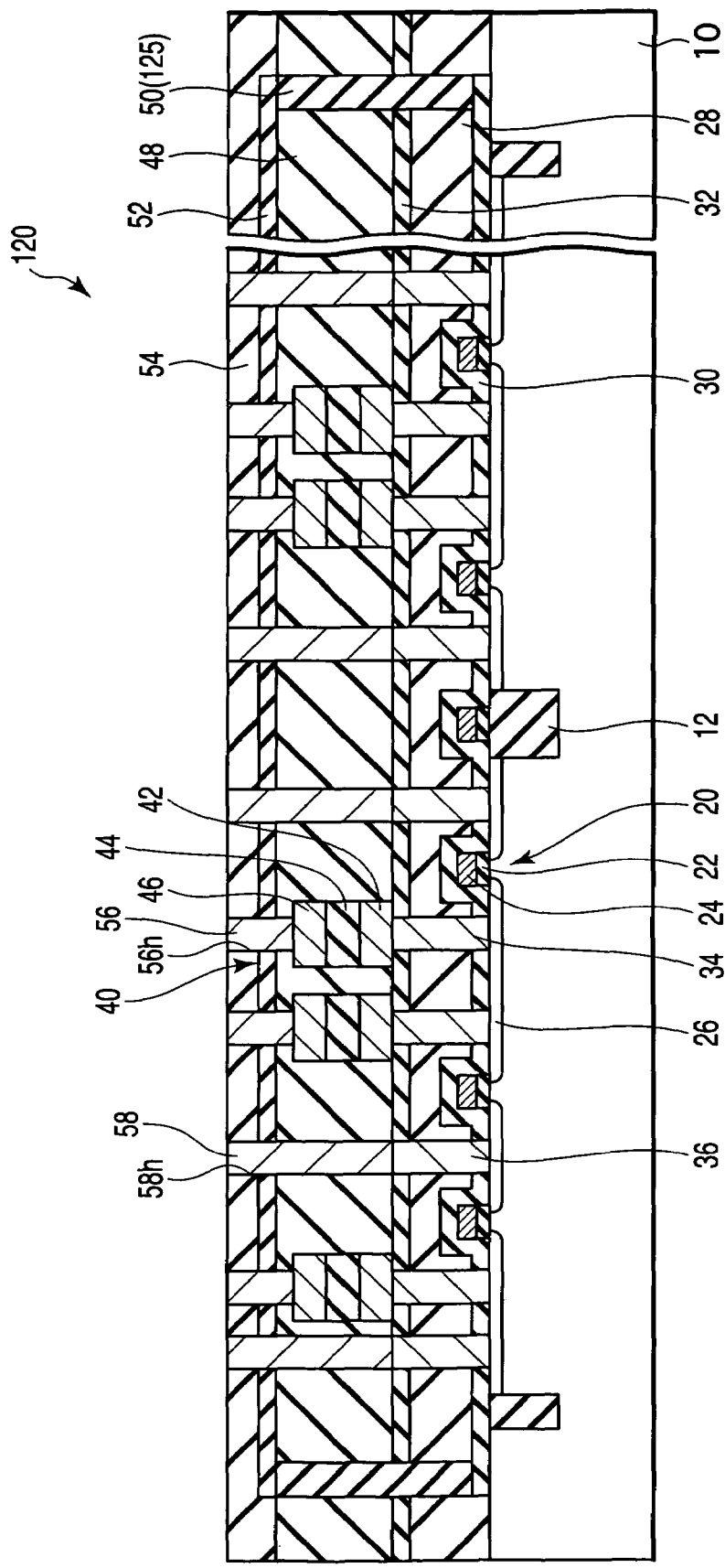

(5) Next, as shown in FIG. 6, a third contact plug 56 connected to the upper electrode 46 of the ferroelectric capacitor 40 and a fourth contact plug 58 connected to the second contact plug 36 are being formed.

Referring to FIG. 6, a third interlevel insulator 54 is formed on an entire surface of the third hydrogen barrier film 52. A third contact hole 56h reaching the upper electrode 46 is formed in the third interlevel insulator 54, third hydrogen barrier film 52, and second interlevel insulator 48 on the ferroelectric capacitor 40 by lithography and etching. Similarly, a fourth contact hole 58h reaching the second contact plug 36 is formed in the third interlevel insulator 54, third hydrogen barrier film 52, and second interlevel insulator 48 on the second contact plug 36 by lithography and etching. A contact plug material is deposited on an entire surface to fill in the third and fourth contact holes 56h, 58h. As the contact plug material, for example, titanium (Ti), TiN, TiAlN, W, aluminum (Al) or the like, or a stacked film of them can be used. The contact plug material deposited on the surface is removed, for example, by CMP. Thus the third and fourth contact plugs 56, 58 can be formed as shown in FIG. 6.

Figure 7:
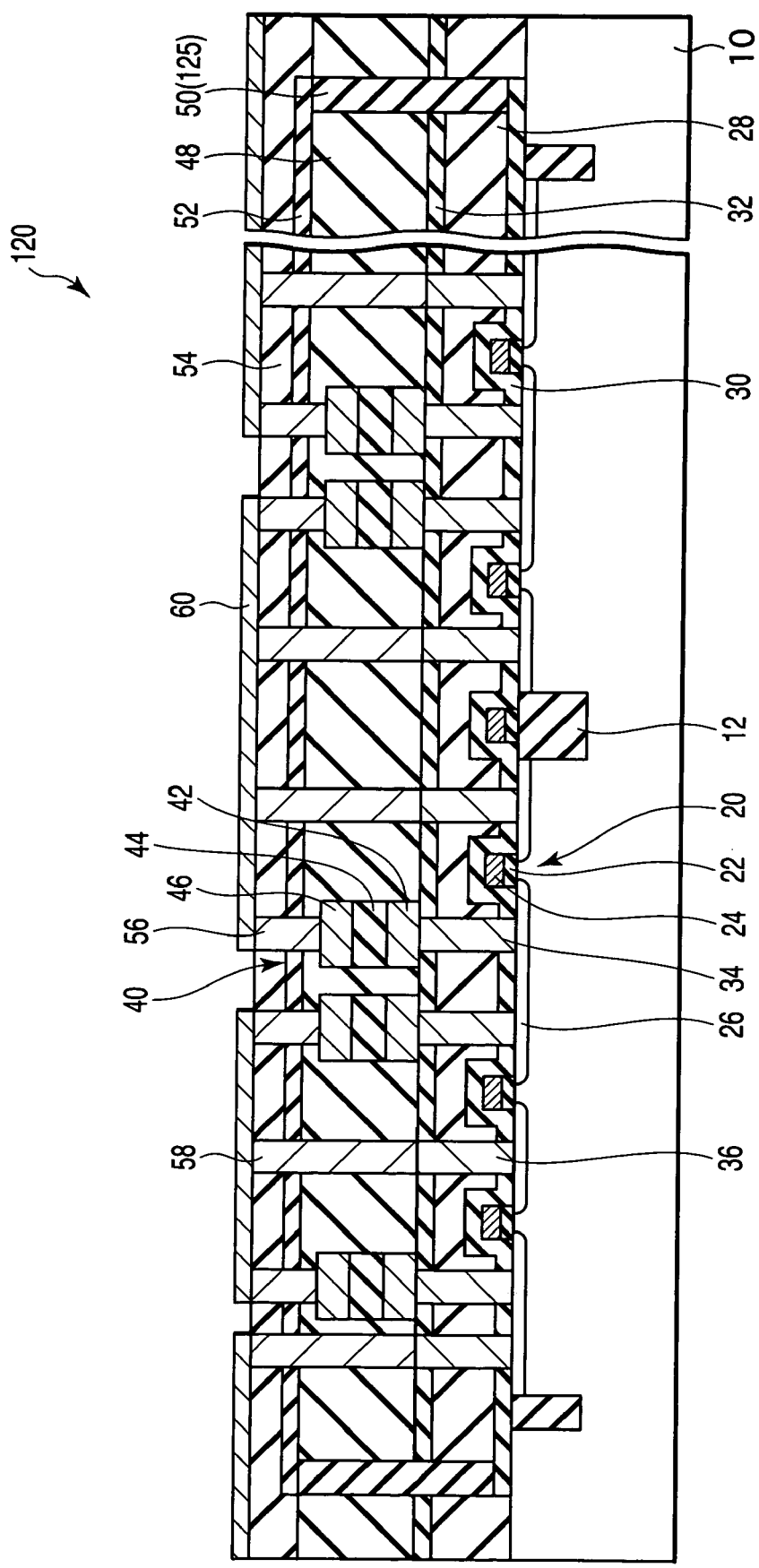

(6) Next, as shown in FIG. 7, a first wiring 60 connected to the third and fourth contact plugs 56, 58 is being formed.

A material for the first wiring 60 is deposited on an entire surface of the third interlevel insulator 54. As a first wiring material, Ti, TiN, Al, a stacked film of them, or copper (Cu) can be used. The first wiring material is patterned by lithography and etching to thereby form the first wiring 60. It is to be noted that in a case where Cu is used as the wiring material, a so-called damascene process can be used. In the process, a wiring trench is formed in the third interlevel insulator 54, Cu is deposited on an entire surface including the inside of the wiring trench by electrolytic plating, and Cu deposited on a portion other than the wiring trench is removed, for example, by CMP to form a Cu wiring. Then, a fourth interlevel insulator (not shown) covering the first wiring 60 is deposited, and planarized, for example, by the CMP. In this manner, the ferroelectric capacitor cell array 120 of the present embodiment is completed.

Thereafter, necessary processes such as multilevel wiring are performed to a semiconductor device, thus the semiconductor device including a ferroelectric storage device is completed.

As described above, according to the present embodiment, the hydrogen barrier wall 125 constituted of the second hydrogen barrier film 50 which surrounds the whole circumference of the ferroelectric capacitor cell array 120 can be formed to be sufficiently thick. Since the second hydrogen barrier film 50 can be formed independently of another portion of the semiconductor device, there is little restriction on the materials to be used. Thus, the ferroelectric storage device 110 can be formed comprising a structure including: the first hydrogen barrier film 30 formed on the MOS transistor 20; the second hydrogen barrier film 50 (i.e., hydrogen barrier wall 125) formed surrounding the circumference of the ferroelectric capacitor cell array 120; and the third hydrogen barrier film 52 formed above the ferroelectric capacitor cell array 120. The second hydrogen barrier films is brought into contact with the first hydrogen barrier film 30 or the third hydrogen barrier film 52 without any gap in the circumference of the ferroelectric capacitor cell array 120, so that the barrier capability against hydrogen penetration is enhanced.

In the present embodiment, there can be provided a semiconductor storage device comprising a ferroelectric capacitor whose barrier capability against the penetration of hydrogen from the transverse direction is equal to or better than that from another direction, and a method for manufacturing the device.

Modification of First Embodiment

The first embodiment may be modified in such a manner that a second hydrogen barrier film 50 and a third hydrogen barrier film 52 are formed integrally by one hydrogen barrier insulator as briefly described above.

As shown in FIG. 8, in the present modification, for example, a hydrogen barrier insulator of $Al_2O_3$, SiN or the like is used as the second hydrogen barrier film 50. As described in the step (4) of the first embodiment, the second hydrogen barrier film 50 is formed to fill in a trench 50t disposed in a second interlevel insulator 48. As a result, the second hydrogen barrier film 50 is formed from both sides of the trench 50t wall. Therefore, when the second hydrogen barrier film 50 and the third hydrogen barrier film 52 are simultaneously formed, the thickness of the second hydrogen barrier film 50 can be thicker than that of the third hydrogen barrier film 52 formed on the surface, though the thickness of the second hydrogen barrier film 50 is defined by the width of the trench 50t. Furthermore, the second hydrogen barrier film 50 and the third hydrogen barrier film 52 are continuously or integrally formed, and any gap will not be formed in a boundary. Therefore, the method is advantageous as compared with a method for separately forming the films, since the manufacturing process can be simplified.

Second Embodiment

Figure 9:
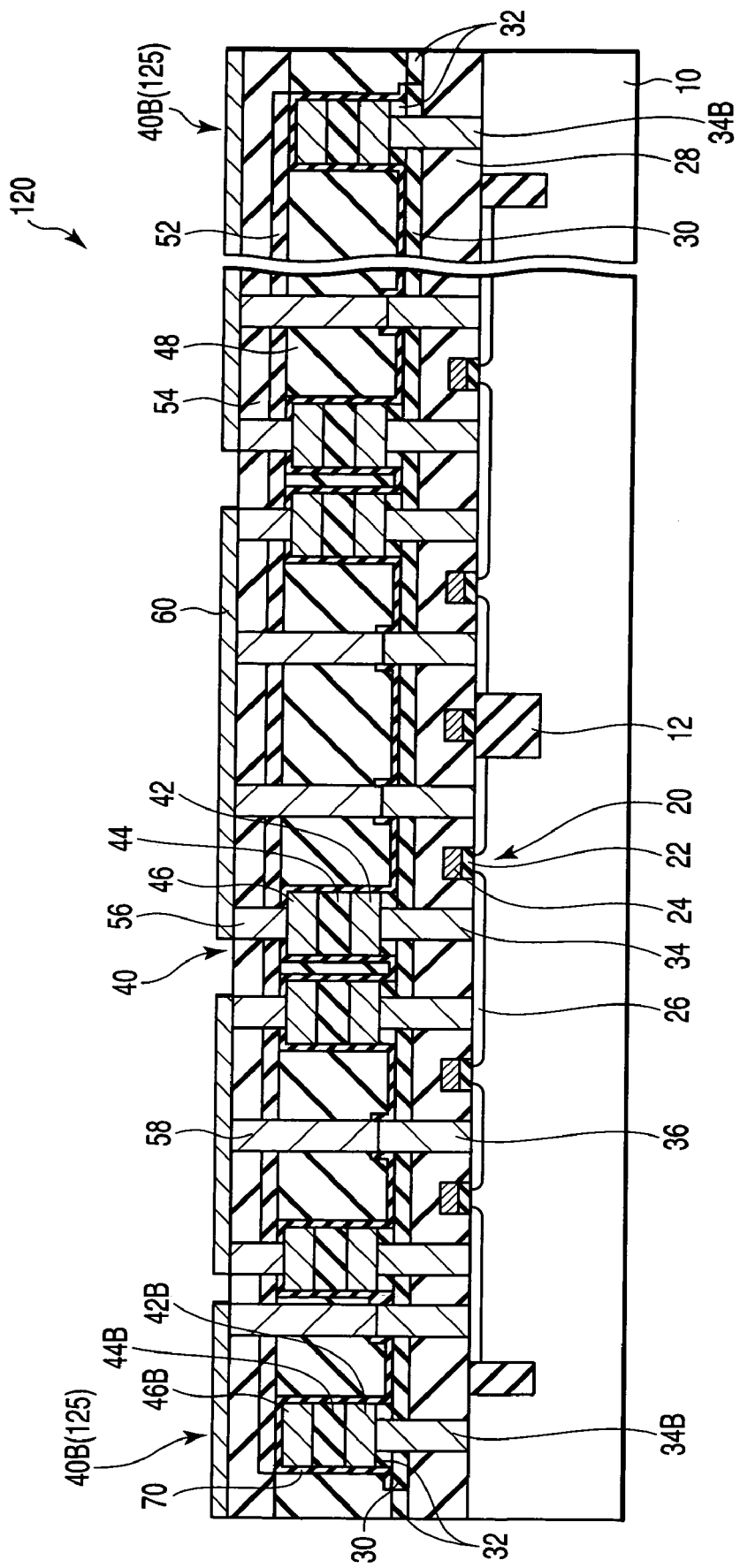
FIG. 9 is a sectional view showing one example of a semiconductor device according to a second embodiment of the present invention.

One example of a sectional structure of a ferroelectric storage device according to a second embodiment is shown in FIG. 9. In the present embodiment, a first hydrogen barrier film 30 is disposed just below a ferroelectric capacitor 40, and a third hydrogen barrier film 52 is disposed above the ferroelectric capacitor 40. Furthermore, a hydrogen barrier wall 125 is formed by a barrier ferroelectric capacitor 40B having the same cross-sectional structure as that of a ferroelectric capacitor 40, instead of a second hydrogen barrier film 50, to surround the circumference of a ferroelectric capacitor cell array 120. The hydrogen barrier wall 125 can generally include a first barrier contact plug 34B, the barrier ferroelectric capacitor 40B, and a second barrier contact plug (not shown). In the present embodiment, a case where any second barrier contact plug is not used will be described. By this structure, in the present embodiment, no additional step is required for forming the hydrogen barrier wall 125, thus the process can be simplified.

One example of the manufacturing process of the semiconductor storage device according to the present embodiment will be described with reference to sectional views shown in FIGS. 10 to 14.

(1) First, as shown in FIG. 10, a MOS transistor 20 is being formed on a silicon substrate 10, a first interlevel insulator 28 is being planarized, and a first hydrogen barrier film 30 is being formed.

Since a method for forming the MOS transistor 20 is the same as that of the first embodiment, description is omitted. Referring to FIG. 10, the first interlevel insulator 28 is deposited on an entire surface of the MOS transistor 20, and thereafter planarized by CMP, for example. Then, the first hydrogen barrier film 30 is deposited on an entire surface of the first interlevel insulator 28. The first interlevel insulator 28 and first hydrogen barrier film similar to those of the first embodiment can be used. The first hydrogen barrier film 30 in a region other than a ferroelectric capacitor cell array region 120A to be formed thereabove is removed by lithography and etching. Thereafter, a first insulator 32 is deposited on an entire surface of the substrate, thus a structure shown in FIG. 10 can be formed.

(2) Next, as shown in FIG. 11, first and second contact plugs 34, 36 and a first barrier contact plug 34B are being formed.

Referring to FIG. 11, first and second contact holes 34h, 36h reaching source/drain 26 are formed in the first insulator 32, first hydrogen barrier film 30, and first interlevel insulator 28 by lithography and etching. Moreover, a ring-shaped continuous first barrier contact trench 34Bt reaching the silicon substrate 10 is formed in the circumference of the ferroelectric capacitor cell array region 120A. For example, tungsten (W) is deposited to fill inside the first and second contact holes 34h, 36h, and the first barrier contact trench 34Bt. Then, tungsten deposited on the surface is removed by CMP using the first insulator 32 as a stopper, thereby the first and second contact plugs 34, 36 and the first barrier contact plug 34B are formed. Thus, the first and second contact plugs 34, 36, and the wall-shaped first barrier contact plug 34B can be formed as shown in FIG. 11.

The first barrier contact plug 34B can be omitted if a barrier ferroelectric capacitor is being formed directly on the first hydrogen barrier film 30.

Figure 12:
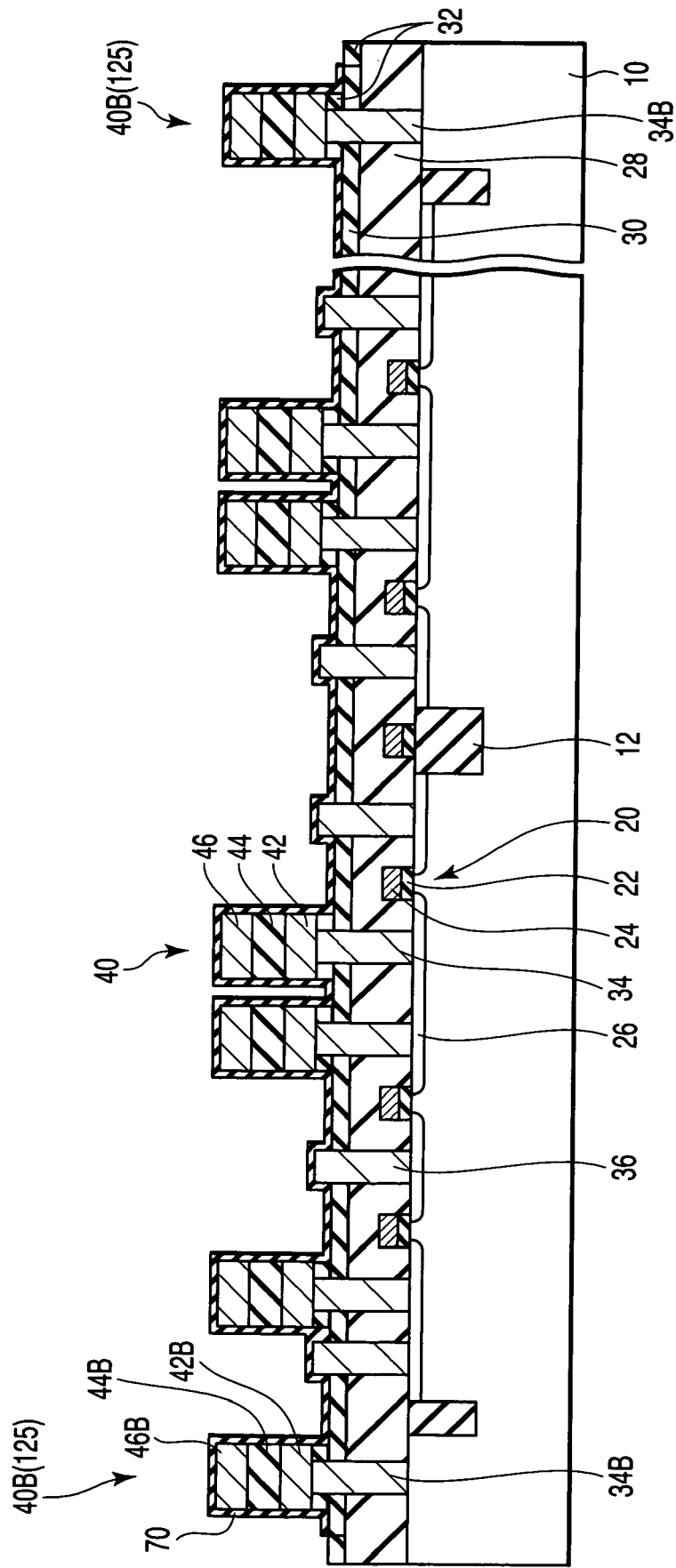

(3) Next, as shown in FIG. 12, a ferroelectric capacitor 40 is being formed on the first contact plug 34, and a wall-shaped barrier ferroelectric capacitor 40B is being formed on the wall-shaped first barrier contact plug 34B.

Referring to FIG. 12, materials constituting a lower electrode 42, a ferroelectric film 44, and an upper electrode 46 of the ferroelectric capacitor 40 are deposited in order on an entire surface of the substrate including on the surface of the first insulator 32. Materials similar to those of the first embodiment can be used in the lower electrode 42, ferroelectric film 44, and upper electrode 46. Thereafter, the upper electrode 46, ferroelectric film 44, and lower electrode 42 are processed by lithography and etching using one mask, thus the ferroelectric capacitor 40 connected to the first contact plug 34 is formed. In the etching process, the first insulator 32 in a portion other than a portion under the ferroelectric capacitor 40 within the ferroelectric capacitor cell array 120 is removed to expose the first hydrogen barrier film 30. Simultaneously, the wall-shaped barrier ferroelectric capacitor 40B connected to the wall-shaped first barrier contact plug 34B is formed in the circumference of the region surrounding the ferroelectric capacitor cell array.

Figure 14:
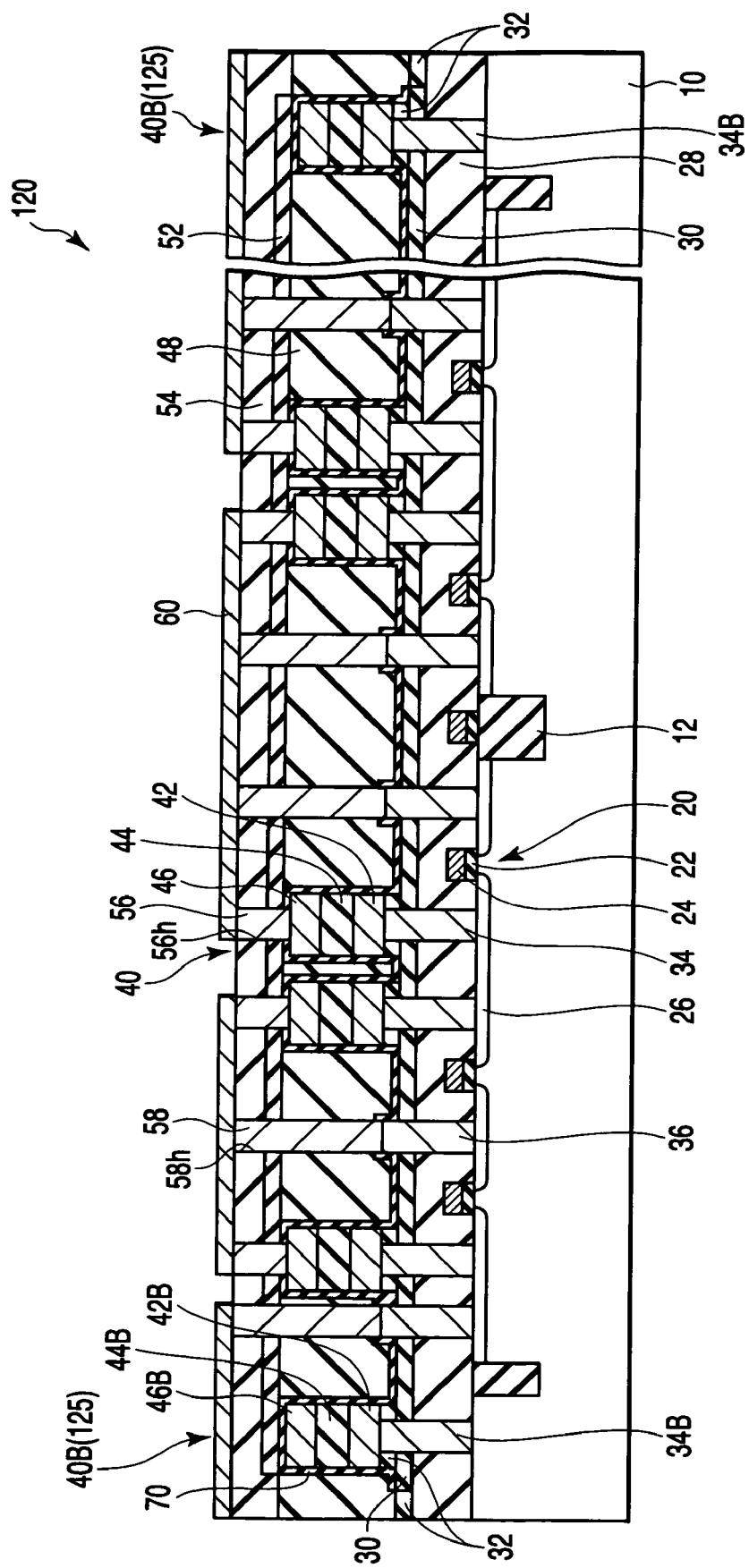

Moreover, the ferroelectric capacitor 40 and the barrier ferroelectric capacitor 40B are covered with a cover barrier insulator 70. The cover barrier insulator 70 is brought into contact with the first hydrogen barrier film 30 between the ferroelectric capacitors 40, 40B. As the cover barrier insulator 70, a material having a barrier capability against hydrogen, such as $Al_2O_3$, SiN, can be used. It is to be noted that this cover barrier insulator 70 can be omitted as shown in FIG. 14.

Thus, as shown in FIG. 12, the hydrogen barrier wall 125 including the wall-shaped barrier ferroelectric capacitor 40B can be formed in the circumference of the ferroelectric capacitor cell array 120 simultaneously with the forming of the ferroelectric capacitor 40.

Figure 13:
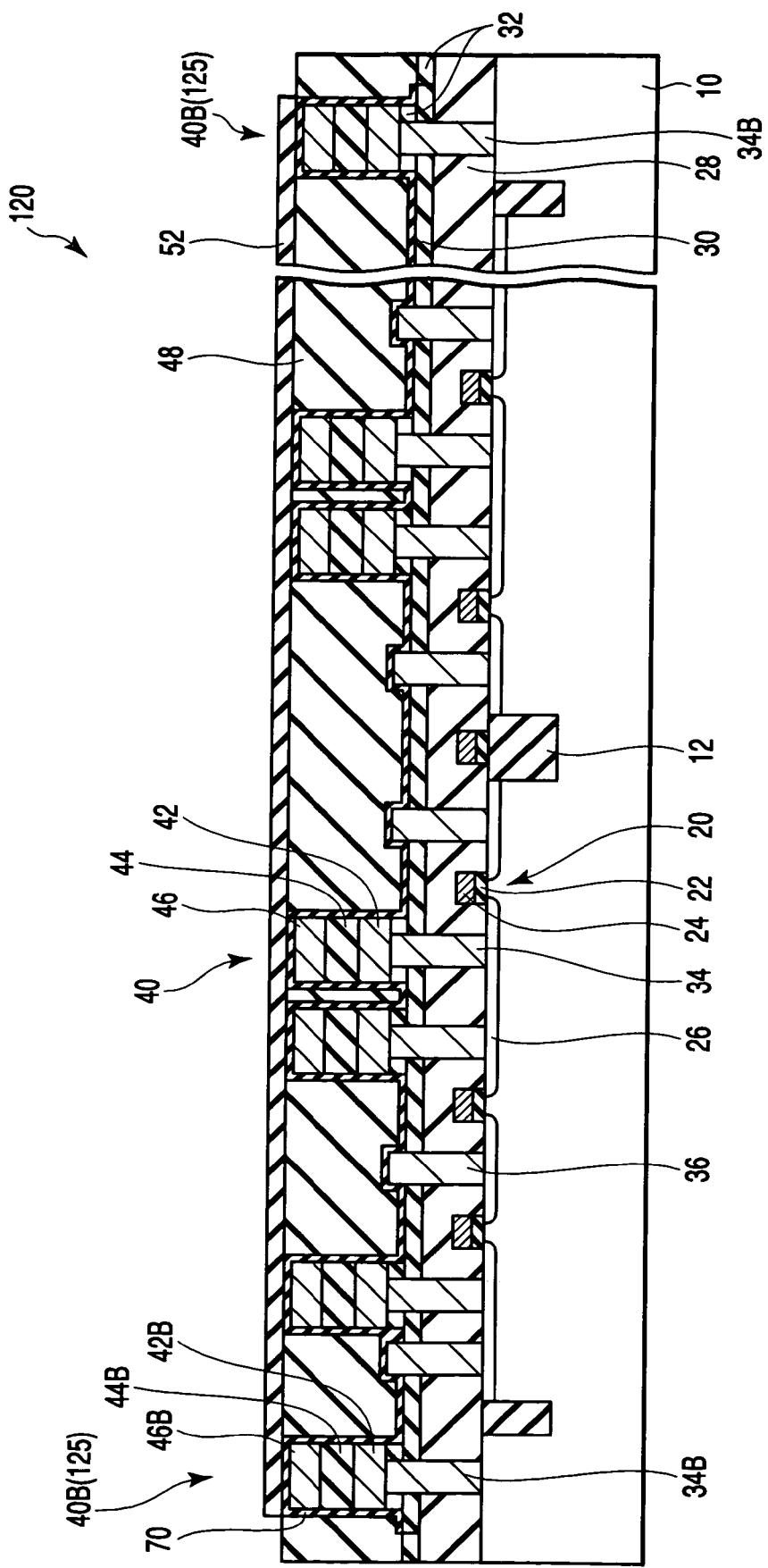

(4) Next, as shown in FIG. 13, a second interlevel insulator 48 is being formed to fill in a space between the ferroelectric capacitors 40 and the barrier ferroelectric capacitor 40B, and a third hydrogen barrier film 52 is being formed on the second interlevel insulator 48 on the ferroelectric capacitor cell array 120.

Referring to FIG. 13, the second interlevel insulator 48 is deposited to be thick to fill in the space between the ferroelectric capacitors 40 and the barrier ferroelectric capacitor 40B. The second interlevel insulator 48 is planarized, for example, by CMP using the cover barrier insulator 70 on the ferroelectric capacitor 40 as a stopper. Thereafter, the third hydrogen barrier film 52 is deposited on an entire surface, thus the whole ferroelectric capacitor cell array 120 is covered with the hydrogen barrier film. The third hydrogen barrier film 52 in a region other than the ferroelectric capacitor cell array 120 is removed by lithography and etching.

As described above, the whole ferroelectric capacitor cell array 120 can be surrounded with the first hydrogen barrier film 30, hydrogen barrier wall 125, and third hydrogen barrier film 52.

Furthermore, performing steps (5) and after of the first embodiment, third and fourth contact plugs 56, 58, first wiring 60 and the like are formed. Thus the ferroelectric capacitor cell array 120 of the present embodiment is completed as shown in FIG. 14.

Thereafter, steps required for the semiconductor device, such as multilevel wiring, are performed, and the semiconductor device including the ferroelectric storage device is completed.

The hydrogen barrier wall 125 of the present embodiment is constituted of the material having the barrier capability against the hydrogen (contact plug, upper electrode, lower electrode, cover barrier insulator) and the material which absorbs hydrogen (ferroelectric film). Therefore, there can be provided a semiconductor storage device comprising a ferroelectric capacitor whose barrier capability against the penetration of hydrogen from the transverse direction is equal to or better than that from any other directions, and a method for manufacturing the device.

Modification of Second Embodiment

Figure 15:
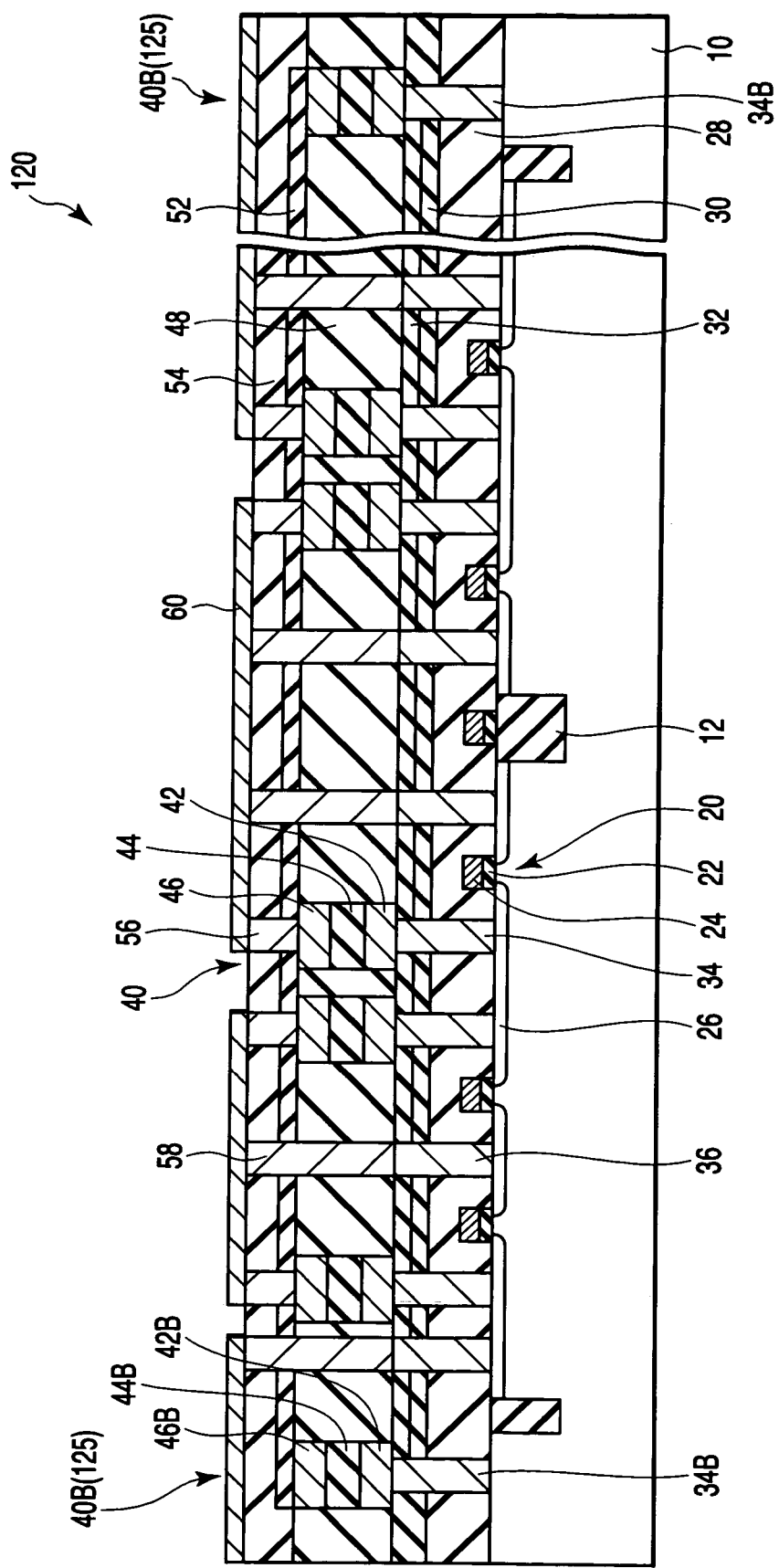
FIG. 15 is a sectional view showing one example of a semiconductor device according to a modification of the second embodiment.

As described above, in the second embodiment, a cover barrier insulator 70 can be omitted as shown in FIG. 15. Even when the cover barrier insulator is omitted, since a width of a barrier ferroelectric capacitor 40B is larger than that of a second hydrogen barrier film 50 of the first embodiment, hydrogen that has penetrated in the barrier ferroelectric film is mostly blocked by or absorbed in the barrier ferroelectric film 40B. Therefore, the hydrogen barrier wall 125 having a structure from which the cover barrier insulator 70 of the barrier ferroelectric capacitor 40B is omitted according to the present modification has a sufficient barrier capability against the penetration of hydrogen from the transverse direction.

Third Embodiment

Figure 16:
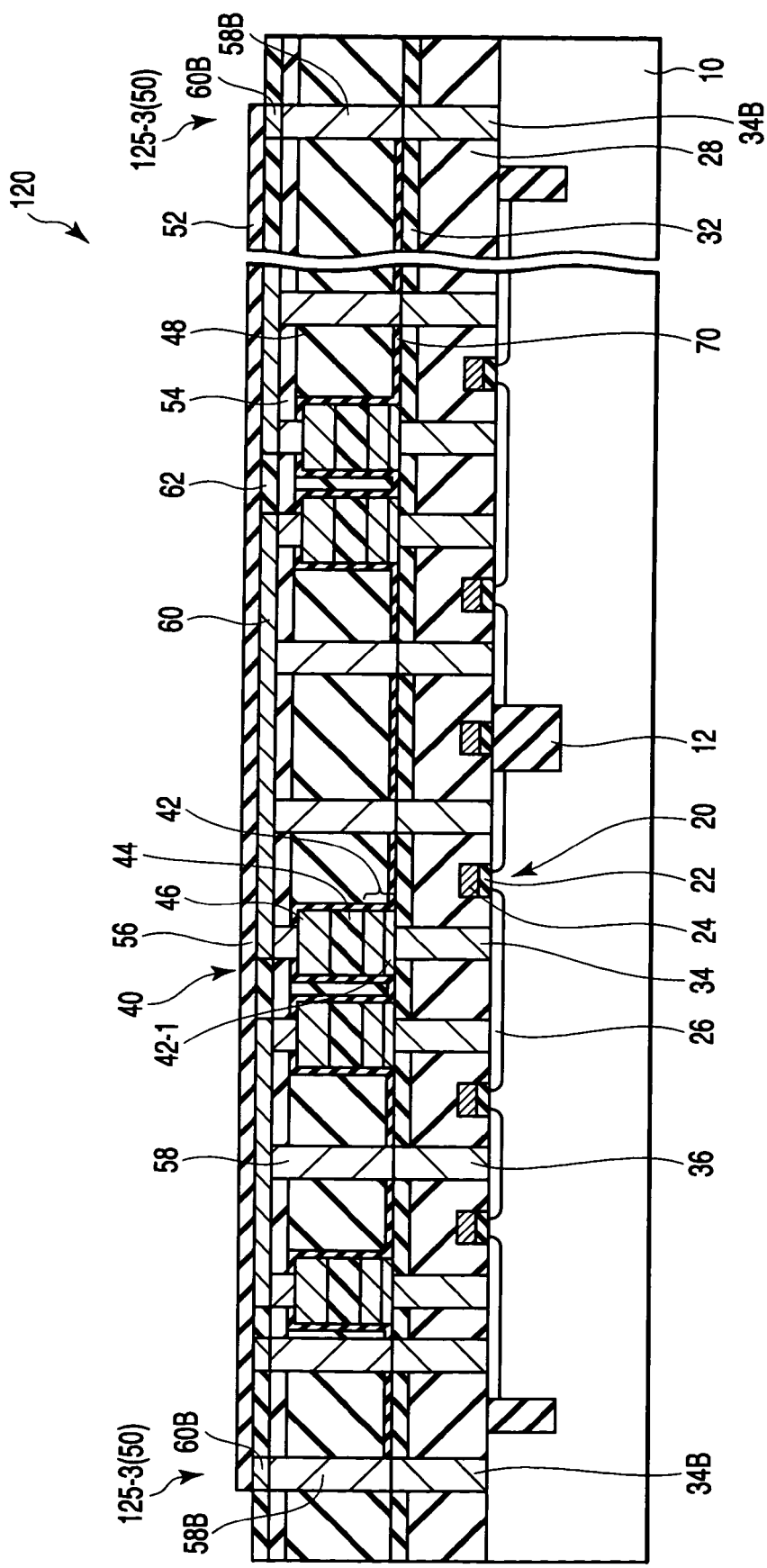
FIG. 16 is a sectional view showing one example of a semiconductor device according to a third embodiment of the present invention.

One example of a sectional structure of a ferroelectric storage device of a third embodiment is shown in FIG. 16. The present embodiment relates to a ferroelectric storage device from which a first hydrogen barrier film is omitted and in which a hydrogen barrier wall 125-3 (second hydrogen barrier film 50) is formed of contact plugs 34B, 58B having hydrogen barrier capabilities. Furthermore, a third hydrogen barrier film 52 is formed above a first wiring 60. In the present embodiment, the first hydrogen barrier film is omitted, but a lower electrode 42 of a ferroelectric capacitor 40 is formed into a multilayer structure including a material 42-1 having a barrier capability. Accordingly, the hydrogen barrier capability of the ferroelectric capacitor 40 from lower side is enhanced.

In the present embodiment, no additional step for forming the hydrogen barrier wall 125-3 is required, thus the process can be simplified in the same manner as in the second embodiment.

One example of the manufacturing process of the semiconductor storage device according to the present embodiment will be described with reference to sectional views shown in FIGS. 17 to 21.

(1) First, as shown in FIG. 17, a MOS transistor 20 is being formed on a silicon substrate 10, a first interlevel insulator 28 is being planarized, and a first hydrogen barrier film 30 is being formed.

Since a method for forming the MOS transistor 20 is the same as that of the first embodiment, description is omitted. Referring to FIG. 17, the first interlevel insulator 28 is deposited on an entire surface of the MOS transistor 20, and thereafter planarized by CMP. Then, the first insulator 32 is deposited on an entire surface of the first interlevel insulator 28, thus a structure shown in FIG. 17 can be formed.

(2) Next, as shown in FIG. 18, first and second contact plugs 34, 36 and a first barrier contact plug 34B are being formed.

Referring to FIG. 18, first and second contact holes 34h, 36h reaching sources/drains 26 are formed in the first insulator 32 and first interlevel insulator 28 by lithography and etching. Simultaneously, a first barrier contact trench 34Bt reaching the silicon substrate 10 is formed in a circumference of a ferroelectric capacitor cell array region 120A. Contact plug materials 34m, 36m are deposited to fill in the first and second contact holes 34h, 36h, and the first barrier contact trench 34Bt. As the contact plug materials, a material superior in hydrogen barrier capability, such as TiAlN, TiAl, Al, W, or a stacked film of them can be used. Moreover, the contact plug materials 34m, 36m deposited on the surface are removed by CMP using the first insulator 32 as a stopper, thereby the first and second contact plugs 34, 36 and the first barrier contact plug 34B are formed. Thus, the first and second contact plugs 34, 36, and the wall-shaped first barrier contact plug 34B can be formed as shown in FIG. 18.

Figure 19:
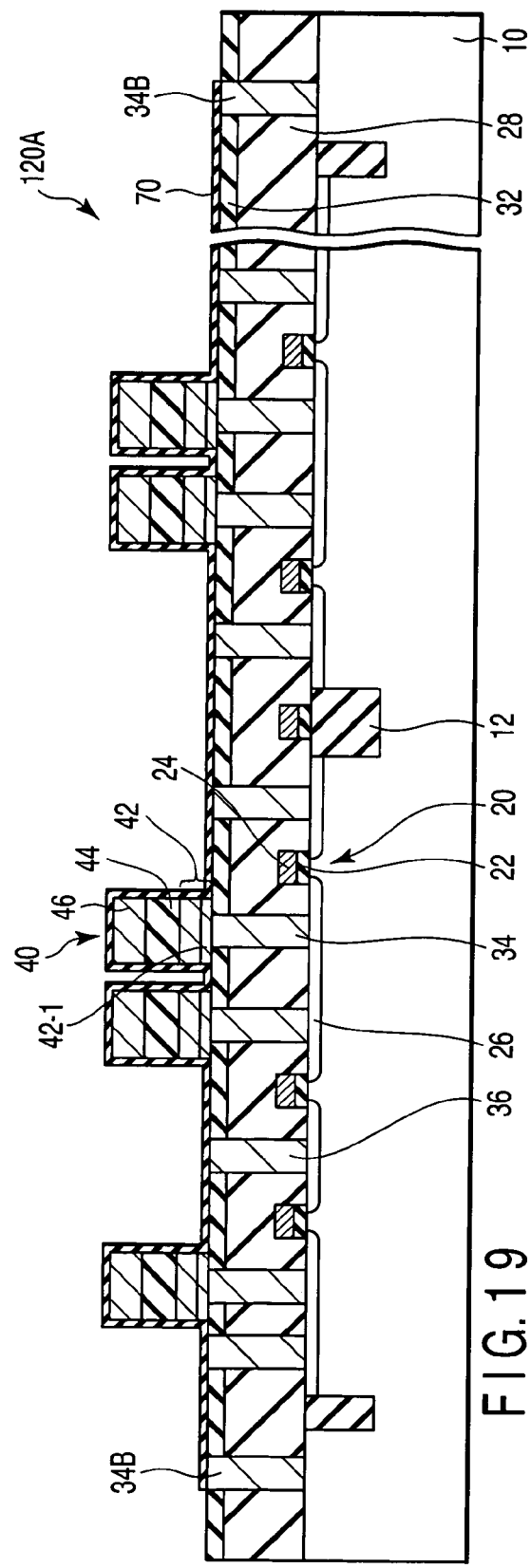

(3) Next, as shown in FIG. 19, a ferroelectric capacitor 40 is being formed on the first contact plug 34.

Figure 22:
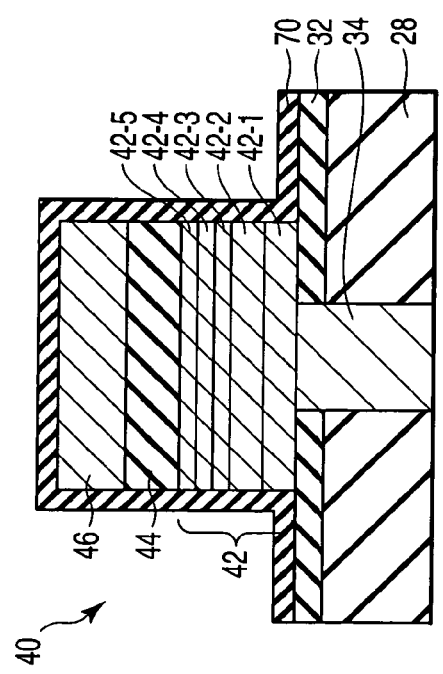
FIG. 22 is an enlarged view of one example of a ferroelectric capacitor according to the third embodiment.

Referring to FIG. 19, a material constituting a lower electrode 42 of the ferroelectric capacitor 40 is deposited on an entire surface including the surface of the first insulator 32. The lower electrode 42 is preferred to have a laminated structure. As to the lower electrode 42, a material having a high hydrogen barrier capability, such as TiAlN or TiN, is preferably formed on the first insulator 32 as a lowermost layer. Film(s) commonly used in the lower electrode, such as Ir, $IrO_2$, Pt, SrRuO, can be stacked on the layer. Specifically, as shown in FIG. 22, an enlarged view of one example of the capacitor 40 is illustrated in which a stacked film of TiAlN 42-1, Ir 42-2, $IrO_2$ 42-3, Pt 42-4, and SrRuO 42-5 is used. Materials constituting the ferroelectric film 44 and upper electrode 46 are deposited in order on the lower electrode 42. The materials similar to those of the first embodiment can be used in the ferroelectric film 44 and upper electrode 46. Thereafter, the upper electrode 46, ferroelectric film 44, and lower electrode 42 are processed by lithography and etching using one mask, thus the ferroelectric capacitor 40 connected to the first contact plug 34 is formed.

Moreover, the ferroelectric capacitor 40 is covered with a cover barrier insulator 70. As the cover barrier insulator 70, a material, such as $Al_2O_3$, SiN, having a barrier capability against hydrogen can be used. It is to be noted that the cover barrier insulator 70 can be omitted in the same manner as in the second embodiment.

Figure 20:
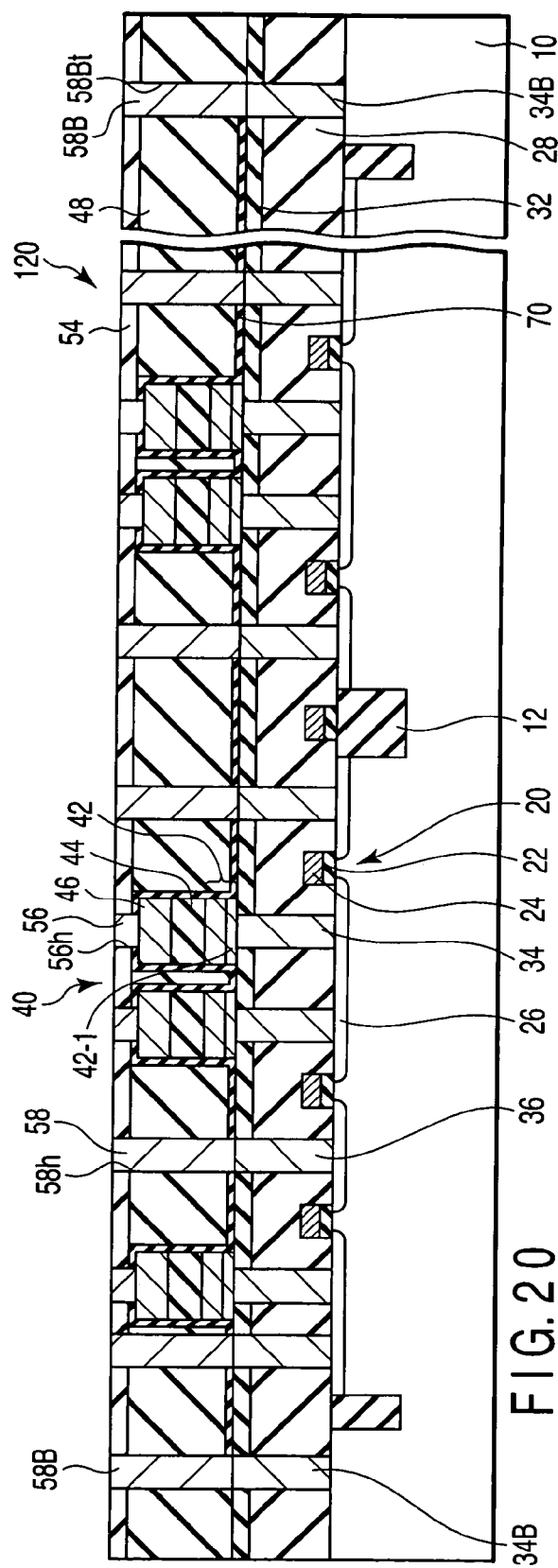

(4) Next, as shown in FIG. 20, the ferroelectric capacitor 40 is being planarized with the second interlevel insulator 48, and a third contact plug 56 connected to the upper electrode 46 of the ferroelectric capacitor 40, and a fourth contact plug 58 connected to the second contact plug 36 are being formed. Simultaneously with the forming of the fourth contact plug 58, a wall-shaped second barrier contact plug 58B connected to the first barrier contact plug 34B surrounding the ferroelectric capacitor cell array 120 is being formed.

Referring to FIG. 20, the second interlevel insulator 48 is deposited to be thick to fill in a space between the ferroelectric capacitors 40. As the second interlevel insulator 48, a material which can be isotropically deposited at a low temperature, for example, $CVD$-$SiO_2$ using $TEOS$-$O_3$ can be used. Moreover, the second interlevel insulator 48 is planarized, for example, by CMP using the cover barrier insulator 70 as a stopper. A third interlevel insulator 54 is formed on an entire surface of the second interlevel insulator 48. A third contact hole $56h$ is formed in the third interlevel insulator 54 and second interlevel insulator 48 on the ferroelectric capacitor 40 by lithography and etching. Similarly, a fourth contact hole $58h$ is formed in the third interlevel insulator 54 and second interlevel insulator 48 on the second contact plug 36 by lithography and etching. Simultaneously with the forming of the fourth contact hole $58h$, a continuous second barrier contact trench 58Bt is formed on the wall-shaped first barrier contact plug 34B surrounding the ferroelectric capacitor cell array 120. Contact plug materials are deposited on an entire surface to fill in the third and fourth contact holes $56h$, $58h$ and the second barrier contact trench 58Bt. As the contact plug materials, the materials of the first and second contact plugs 34, 36 can be used. The contact plug material deposited on the surface is removed, for example, by CMP using the third interlevel insulator 54 as a stopper.

In this way, the third and fourth contact plugs 56, 58 and the second contact plug 36 can be formed as shown in FIG. 20.

Figure 21:
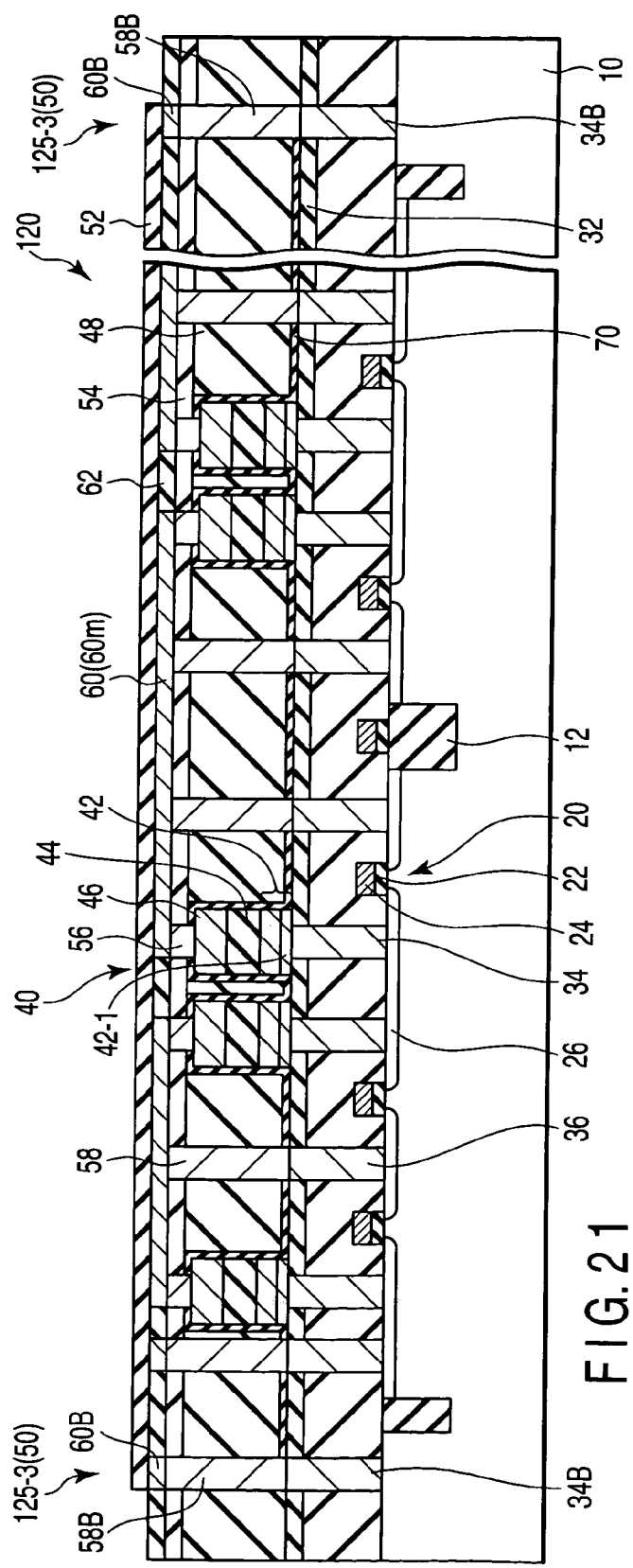

(5) Next, as shown in FIG. 21, a first wiring 60 connected to the third and fourth contact plugs 56, 58 is being formed, and a third hydrogen barrier film 52 is being formed above the first wiring 60 to cover the ferroelectric capacitor cell array 120.

Referring to FIG. 21, a first wiring material $60m$ is deposited on an entire surface including the surface of the third interlevel insulator 54. As the first wiring material $60m$, the above-described materials for the contact plug can be used. The first wiring material $60m$ is patterned by lithography and etching to form the first wiring 60. Moreover, a first barrier wiring 60B is formed on the wall-shaped second barrier contact plug 58B formed surrounding the ferroelectric capacitor cell array 120. Thus, a hydrogen barrier wall 125-3 (second hydrogen barrier film 50) constituted of the first barrier contact plug 34B, the second barrier contact plug 58B and the first barrier wiring 60B can be formed to surround the ferroelectric capacitor cell array 120.

Furthermore, a fourth interlevel insulator 62 is deposited on an entire surface to cover the first wiring 60, and planarized, for example, by CMP to expose the surface of the first wiring 60. Thereby the first wiring 60 is filled in the fourth interlevel insulator 62.

Next, the third hydrogen barrier film 52 is formed on an entire surface of the first wiring 60 and the fourth interlevel insulator 62 to be contacted with the first wiring 60 and first barrier wiring 60B. The third hydrogen barrier film 52 in a region outside the ferroelectric capacitor cell array 120 is removed by lithography and etching. The third hydrogen barrier film 52 formed in this manner contacts with the first barrier wiring 60B, which is the upper surface of the hydrogen barrier wall 125-3, without any gap in the circumference of the ferroelectric capacitor cell array 120.

Accordingly, the ferroelectric capacitor cell array 120 of the present embodiment shown in FIG. 21 is completed.

Thereafter, steps necessary for the semiconductor device, such as multilevel wiring, are performed, and the semiconductor device including the ferroelectric storage device is completed.

Since the hydrogen barrier wall 125-3 of the present embodiment is constituted of the materials having the hydrogen barrier capability, the wall has a high barrier capability against the penetration of hydrogen from the transverse direction. Furthermore, the barrier contact plug and the barrier wiring can be covered with an additional $Al_2O_3$ or SiN, and then the barrier capability of the hydrogen barrier wall 125-3 against hydrogen can be enhanced. Since the hydrogen barrier wall 125-3 comprises the barrier contact plug, the area can be reduced as compared with a case where the wall is formed by the barrier ferroelectric capacitor.

As described above, in the present embodiment, there is provided a semiconductor storage device comprising a ferroelectric capacitor whose barrier capability against the penetration of hydrogen from the transverse direction is equal to or higher than that from any another direction, and a method for manufacturing the device.

Modifications of First, Second, and Third Embodiments

The first to third embodiments can be variously modified and carried out. In the above-described embodiments, the forming of three types of first hydrogen barrier films 30, three types of the structure of second hydrogen barrier films 50, that is, the hydrogen barrier wall 125, and two types of the forming positions of the third hydrogen barrier films 52 have been described.

Specifically, the first hydrogen barrier film 30 can be formed on the MOS transistor 20, or just below the ferroelectric capacitor 40, or the first hydrogen barrier film 30 is not used. The second hydrogen barrier film 50, that is, the hydrogen barrier wall 125 can be formed of the hydrogen barrier material, the barrier ferroelectric capacitor 40B, or the barrier contact plugs 34B, 58B, and the barrier wiring 60B. The third hydrogen barrier film 52 can be formed on the ferroelectric capacitor 40, or on the first wiring 60.

Figure 23:
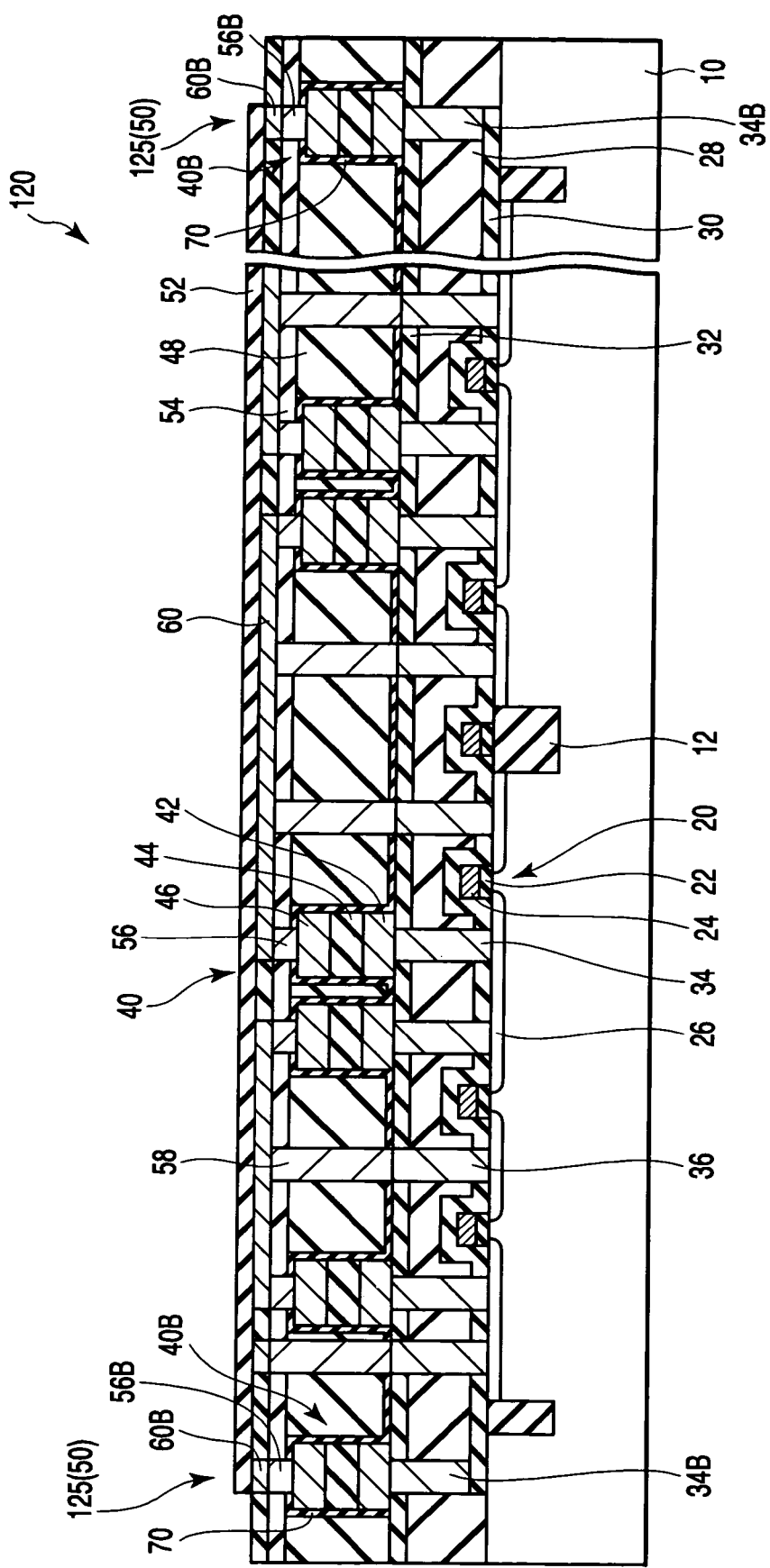
FIG. 23 is a sectional view showing one example of a semiconductor device according to a modification of the first to third embodiments of the present invention.

Combinations of these hydrogen barrier films are not limited to the above-described embodiments, and any combinations may be allowed as far as a condition meets that the hydrogen barrier films surround the ferroelectric capacitor cell array 120 without forming any gaps. All the combinations are not described, but one example is shown in FIG. 23. In a combination of this modified example, a first hydrogen barrier film 30 is formed on the MOS transistor 20 as in the first embodiment, a hydrogen barrier wall 125 (second hydrogen barrier film 50) is formed by a barrier ferroelectric capacitor 40B, barrier contact plugs 34B, 56B, and barrier wiring 60B as in the second embodiment, and a third hydrogen barrier film 52 is formed above a first wiring 60 as in the third embodiment.

In addition to the combination of the respective hydrogen barrier films, a place where the hydrogen barrier wall 125 (second hydrogen barrier film 50) is formed is modified from to surround one ferroelectric capacitor cell array 120 to other places, and the present invention may be carried out in this manner. Examples are shown in fourth and fifth embodiments.

Fourth Embodiment

A fourth embodiment relates to a ferroelectric storage device 400 comprising a ferroelectric capacitor cell array 120, column control circuit 130, row control circuit 140, and memory driving circuit 150. In the present embodiment, the hydrogen barrier wall 125 is formed to surround a plurality of ferroelectric capacitor cell arrays 120, and a plurality of column control circuits 130 and row control circuits 140.

Figure 24:
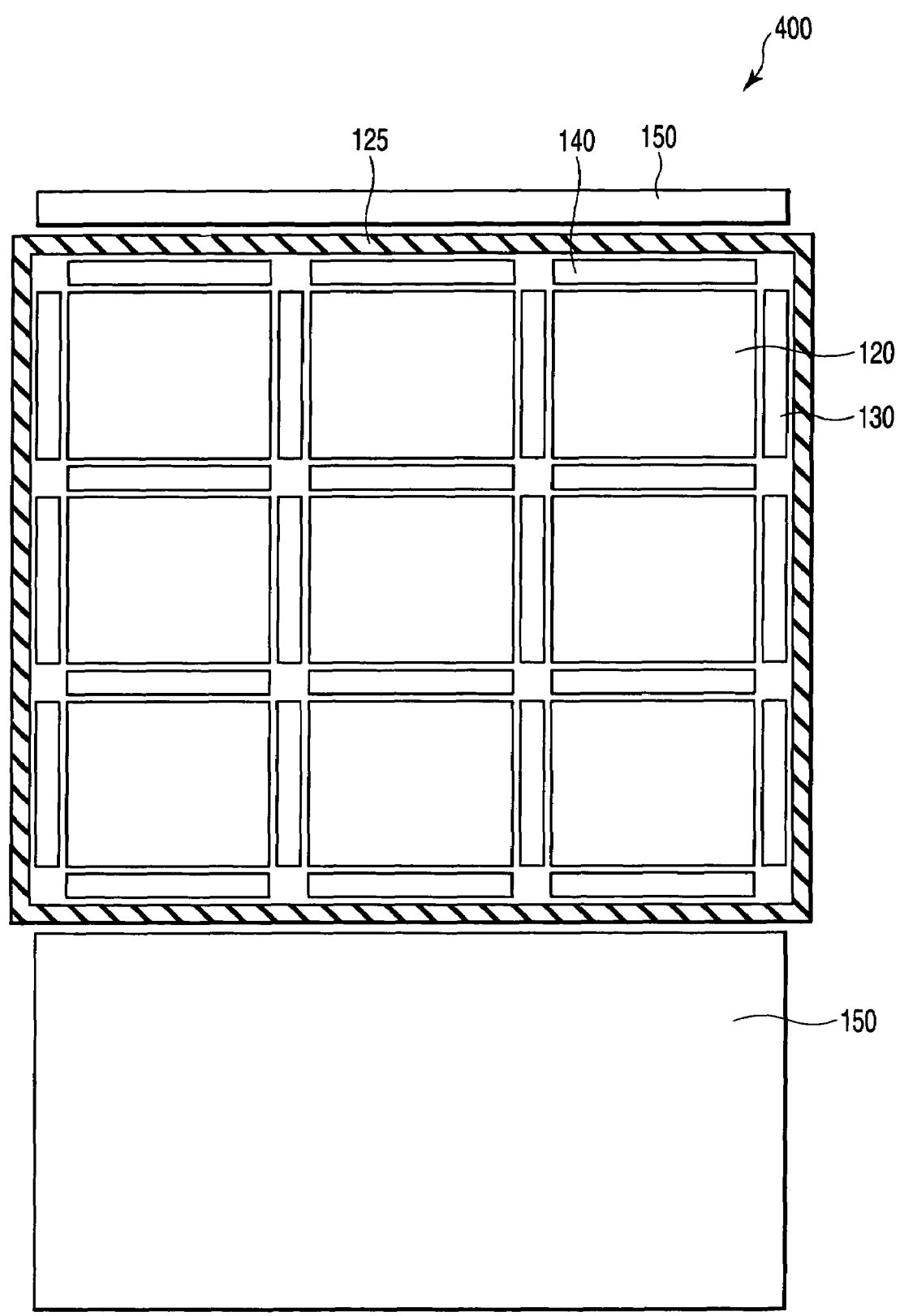
FIG. 24 is a plan view of a ferroelectric storage device showing one example of a fourth embodiment of the present invention.

One example of a plan view of the semiconductor device 400 of the present embodiment is shown in FIG. 24. In the semiconductor device 400 of the present embodiment, the hydrogen barrier wall 125 is formed to surround all of the plurality of ferroelectric capacitor cell arrays 120, and the plurality of column control circuits 130 and row control circuits 140 disposed between upper and lower memory driving circuits 150 of the ferroelectric storage device. The first, second, and third hydrogen barrier films can be formed by any combinations of the first to third embodiments and the modifications.

When the hydrogen barrier wall 125 is disposed in this manner, a distance between the ferroelectric capacitor cell array 120, and the column and row control circuits 130, 140 can be reduced as compared with the first to third embodiments in which each ferroelectric capacitor cell array 120 is surrounded with the hydrogen barrier wall 125. As a result, the size of the semiconductor device 400 can be reduced.

Fifth Embodiment

A fifth embodiment relates to a semiconductor device 500 comprising a ferroelectric storage device 110 and a peripheral circuit 190 including a logic device. In the embodiment, a hydrogen barrier wall 125 is formed to surround a whole ferroelectric storage device 110 portion.

Figure 25:
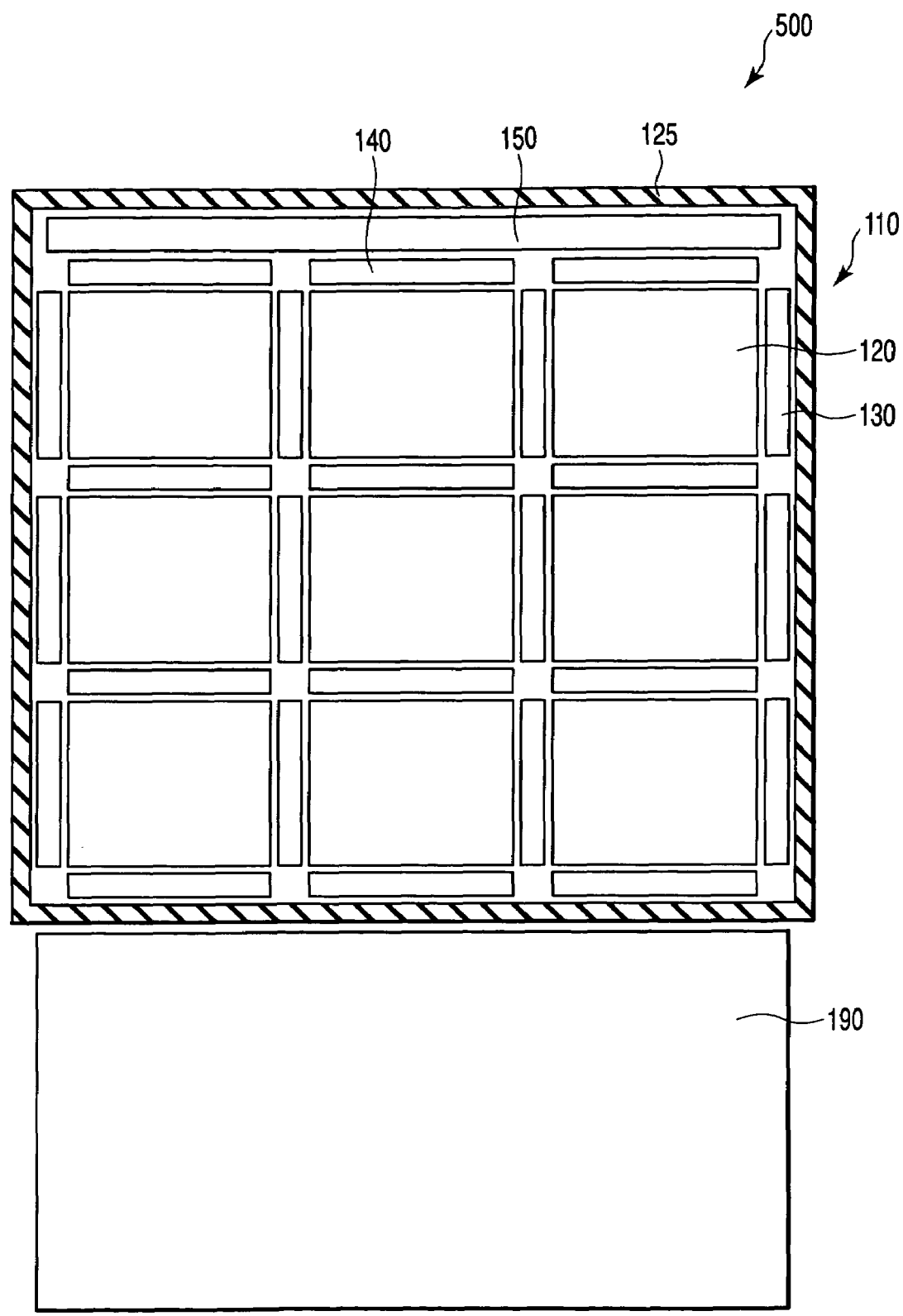
FIG. 25 is a plan view of a ferroelectric storage device showing one example of a fifth embodiment of the present invention.

One example of a plan view of the semiconductor device 500 of the present embodiment is shown in FIG. 25. The ferroelectric storage device 110 portion of the semiconductor device 500 of the present embodiment comprises a plurality of ferroelectric capacitor cell arrays 120, a plurality of column control circuits 130 and row control circuits 140, and a memory driving circuit 150. In the present embodiment, the hydrogen barrier wall 125 is formed to surround all of the ferroelectric capacitor cell arrays 120, column control circuits 130, row control circuits 140, and memory driving circuit 150 of the ferroelectric storage device 110 portion. The first, second, and third hydrogen barrier films can be formed by any combinations of the films described in the first to third embodiments and the modifications in the same manner as in the fourth embodiment.

Since the hydrogen barrier wall 125 is disposed in this manner, a distance between the ferroelectric capacitor cell array 120, and the column and row control circuits 130, 140 can be reduced in the same manner as in the fourth embodiment as compared with the first to third embodiments in which each ferroelectric capacitor cell array 120 is surrounded with the hydrogen barrier wall 125. As a result, the size of the ferroelectric semiconductor device portion can be reduced, thereby the semiconductor device 500 can be minimized.

As described above, according to the present invention, there is provided a semiconductor storage device comprising a ferroelectric capacitor whose barrier capability against the penetration of hydrogen from the transverse direction is equal to or higher than that from any another directions, and a method for manufacturing the device.

The materials, places of forming, and applications of the respective hydrogen barrier films of the present invention is not limited to those of the above-described embodiments, and may be variously modified and carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor storage device comprising:
   a transistor formed on a semiconductor substrate;
   a ferroelectric capacitor formed above the transistor and including a lower electrode, a ferroelectric film, and an upper electrode;
   a first hydrogen barrier film continuously surrounding side portions of a ferroelectric capacitor cell array including a plurality of ferroelectric capacitors, and connected with the semiconductor substrate; and
   a second hydrogen barrier film formed above the ferroelectric capacitor cell array and being brought into contact with the first hydrogen barrier film in a whole periphery.

2. The semiconductor storage device according to claim 1, wherein the first hydrogen barrier film has vertically stacked layers formed like an elongated ferroelectric capacitor to have a sectional shape conforming with a sectional shape of the ferroelectric capacitor.

3. The semiconductor storage device according to claim 1, wherein the first hydrogen barrier film is integrally formed with the second hydrogen barrier film.

4. The semiconductor storage device according to claim 1, further comprising: a third hydrogen barrier film covering each of the ferroelectric capacitors.

5. The semiconductor storage device according to claim 1, wherein the second hydrogen barrier film is formed above a wiring connected to the ferroelectric capacitors.

6. The semiconductor storage device according to claim 1, wherein the first hydrogen barrier film surrounds a plurality of ferroelectric capacitor cell arrays, a plurality of column control circuits, and a plurality of row control circuits, and the first hydrogen barrier film is formed continuously to side portions of the arrays and the circuits.

7. The semiconductor storage device according to claim 1, wherein the first hydrogen barrier film surrounds a plurality of ferroelectric capacitor cell arrays, a plurality of column control circuits, a plurality of row control circuits, and a memory driving circuit, and the first hydrogen barrier film is formed continuously to side portions of the arrays and the circuits.

8. A semiconductor storage device comprising:
   a transistor formed on a semiconductor substrate;
   a ferroelectric capacitor formed above the transistor and including a lower electrode, a ferroelectric film, and an upper electrode;
   a first hydrogen barrier film continuously surrounding side portions of a ferroelectric capacitor cell array including a plurality of ferroelectric capacitors;

a second hydrogen barrier film formed above the ferroelectric capacitor cell array and being brought into contact with the first hydrogen barrier film in a whole periphery, wherein a thickness of the first hydrogen barrier film is thicker than a thickness of the second hydrogen barrier film; and a third hydrogen barrier film formed below the ferroelectric capacitor cell array, the third hydrogen barrier film being brought into contact with the first hydrogen barrier film in a whole periphery.

9. The semiconductor storage device according to claim 8, wherein the first hydrogen barrier film has vertically stacked layers formed like an elongated ferroelectric capacitor to have a sectional shape conforming with a sectional shape of the ferroelectric capacitor.

10. The semiconductor storage device according to claim 8, wherein the first hydrogen barrier film is integrally formed with the second hydrogen barrier film.

11. The semiconductor storage device according to claim 8, further comprising: a fourth hydrogen barrier film covering each of the ferroelectric capacitors.

12. The semiconductor storage device according to claim 8, wherein the second hydrogen barrier film is formed above a wiring connected to the ferroelectric capacitors.

13. The semiconductor storage device according to claim 8, wherein the first hydrogen barrier film surrounds a plurality of ferroelectric capacitor cell arrays, a plurality of column control circuits, and a plurality of row control circuits, and the first hydrogen barrier film is formed continuously to side portions of the arrays and the circuits.

14. The semiconductor storage device according to claim 8, wherein the first hydrogen barrier film surrounds a plurality of ferroelectric capacitor cell arrays, a plurality of column control circuits, a plurality of row control circuits, and a memory driving circuit, and the first hydrogen barrier film is formed continuously to side portions of the arrays and the circuits.

* * * * *